(12) United States Patent
Otaguro et al.

(10) Patent No.: US 7,242,204 B2
(45) Date of Patent: Jul. 10, 2007

(54) SUBSTRATE ALIGNING SYSTEM

(75) Inventors: Tetsunori Otaguro, Tokyo (JP); Seiji Matsuda, Tokyo (JP)

(73) Assignee: Hirata Corporation, Shinagawa-Ku, Tokyo (JP)

( * ) Notice: Subject to any disclaimer, the term of this patent is extended or adjusted under 35 U.S.C. 154(b) by 0 days.

(21) Appl. No.: 11/438,225

(22) Filed: May 23, 2006

(65) Prior Publication Data
US 2006/0208749 A1 Sep. 21, 2006

Related U.S. Application Data

(63) Continuation of application No. PCT/JP04/018041, filed on Dec. 3, 2004.

(30) Foreign Application Priority Data
Dec. 4, 2003 (WO) ........................ PCT/JP03/15541

(51) Int. Cl.
*G01R 31/02* (2006.01)
(52) U.S. Cl. .................... 324/758; 324/158.1
(58) Field of Classification Search ............. 324/158.1, 324/758; 33/286, 533, 645; 414/777, 816
See application file for complete search history.

(56) References Cited

U.S. PATENT DOCUMENTS

| | | | | |
|---|---|---|---|---|
| 4,491,787 A | * | 1/1985 | Akiyama et al. | ........... 324/71.5 |
| 5,046,909 A | * | 9/1991 | Murdoch | ..................... 294/113 |
| 5,533,243 A | * | 7/1996 | Asano | ........................ 29/25.01 |
| 5,642,056 A | * | 6/1997 | Nakajima et al. | ............ 324/758 |
| 5,982,132 A | * | 11/1999 | Colby | ......................... 318/649 |
| 6,043,667 A | * | 3/2000 | Cadwallader et al. | ........ 324/758 |
| 6,332,751 B1 | * | 12/2001 | Kozawa et al. | ............. 414/816 |
| 6,417,683 B1 | * | 7/2002 | Colby | ......................... 324/758 |

FOREIGN PATENT DOCUMENTS

| | | |
|---|---|---|
| JP | 8-335624 | 12/1996 |
| JP | 9-275064 | 10/1997 |
| JP | 2000-133696 | 5/2000 |
| JP | 2002-368065 | 12/2002 |

* cited by examiner

*Primary Examiner*—Ha Tran Nguyen
*Assistant Examiner*—Joshua Benitez
(74) *Attorney, Agent, or Firm*—Buchanan Ingersoll & Rooney PC

(57) ABSTRACT

The present invention provides a substrate aligning system which prevents particles or the like from attaching to a substrate such as a wafer used in the semiconductor manufacturing process, and adjusts the orientation of the substrate accurately within a short period of time. According to a substrate aligning system (A) as a preferred embodiment of the present invention, a plurality of rollers (220) push the peripheral portion of a wafer (W) from different directions to align the center of the wafer. While the center of the wafer is kept aligned by the rollers (220), the contacting portion (211) of a contacting member (210) contacts a chip (Wa) of the wafer (W). The contacting member (210) is then moved arcuately to rotate the wafer (W), thus adjusting the orientation of the wafer.

13 Claims, 21 Drawing Sheets

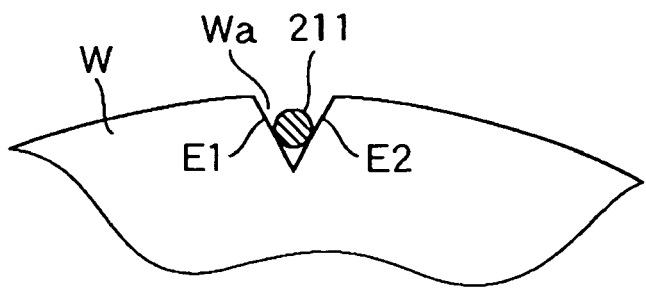
FIG. 5C
FIG. 6
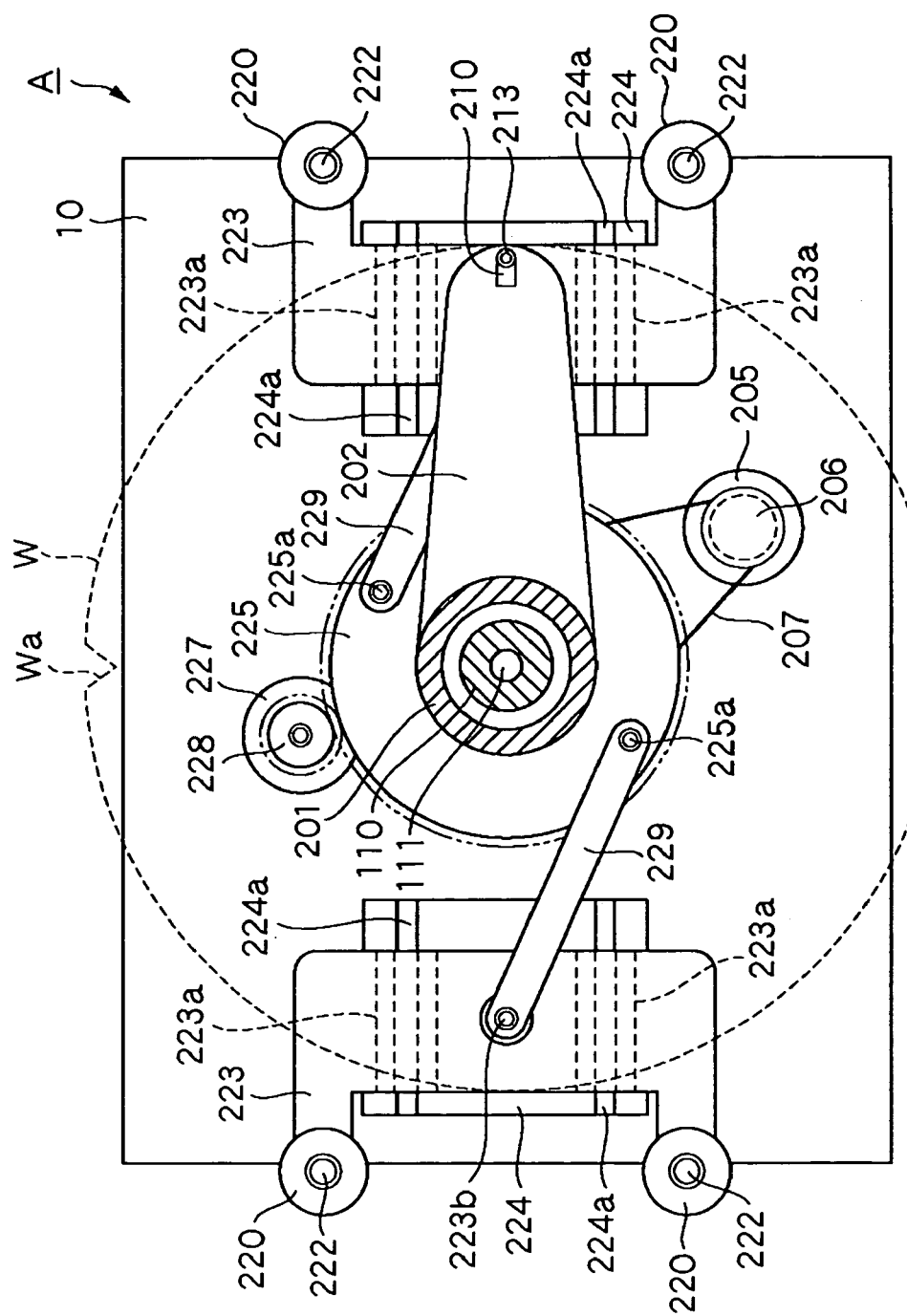

SUBSTRATE ALIGNING SYSTEM

TECHNICAL FIELD

The present invention relates to an aligning technique for a circular substrate represented by a wafer used in the semiconductor manufacturing process.

BACKGROUND ART

In the semiconductor manufacturing process, a circular substrate represented by a wafer is transported among a plurality of types of processing apparatuses and processed sequentially. Every time a substrate is to be loaded in each processing apparatus, its orientation must be adjusted in a predetermined direction. For this purpose, the substrate has a linear chip called an orientation flat, or a V- or U-shaped chip called a notch, in its peripheral portion, so as to indicate the orientation of the substrate. The orientation of the substrate is adjusted with reference to the chip.

As a technique for adjusting the orientation of the substrate, various types of techniques are conventionally proposed. For example, a method is proposed which holds a substrate by attracting its lower surface by a vacuum chuck and rotates the substrate. With this method, however, as a vacuum device comes into contact with the lower surface of the substrate, particles or the like attach to the lower surface of the substrate to influent the yield.

Japanese Patent Laid-Open No. 12-133696 proposes a method of rotating a substrate by clamping it with a clamp. According to this method, while attachment of particles or the like to the substrate can be decreased, the substrate must be reheld several times to detect a chip in the substrate, prolonging the aligning.

According to the method proposed in Japanese Patent Laid-Open No. 2002-368065, a substrate is supported in a non-contact manner with the Bernoulli chuck method. One driving roller and a plurality of idle rollers contact a plurality of peripheral portions of the substrate. The driving roller is rotated to rotate the substrate. With this method, however, a slip may occur between the substrate and driving roller. Even when the driving roller is stopped, the substrate may rotate by the inertia. Thus, the amount of rotation of the substrate cannot necessarily be controlled easily, and the accuracy of adjustment of the substrate orientation is not always high.

DISCLOSURE OF INVENTION

The present invention has been made to solve the problems of the prior art described above, and has as its object to prevent particles or the like from attaching to the substrate and adjust the orientation of the substrate accurately within a short period of time.

In order to achieve the above object, according to the present invention, there is provided a substrate aligning system adjusting an orientation of a circular substrate having a chip in a peripheral portion thereof to indicate the orientation of the substrate, the system comprising a support device for supporting the substrate substantially horizontally in noncontact manner with the substrate, a sensor for detecting the chip of the substrate supported by the support device, and a substrate rotating device for rotating the substrate supported by the support device about a center thereof to adjust the orientation of the substrate, wherein the substrate rotating device includes a contacting member for contacting an edge of the chip, a moving unit for moving the contacting member about a predetermined center of rotation, and defining means for defining a position of the peripheral portion of the substrate so that the center of the substrate coincides with the center of rotation.

BRIEF DESCRIPTION OF DRAWINGS

FIG. 5C is a view showing a state wherein a contacting portion 211 contacts a chip Wa;

FIG. 6 is a (partially omitted) sectional view taken along the line Y-Y of FIG. 2;

BEST MODE FOR CARRYING OUT THE INVENTION

<System Configuration>

Figure 1:
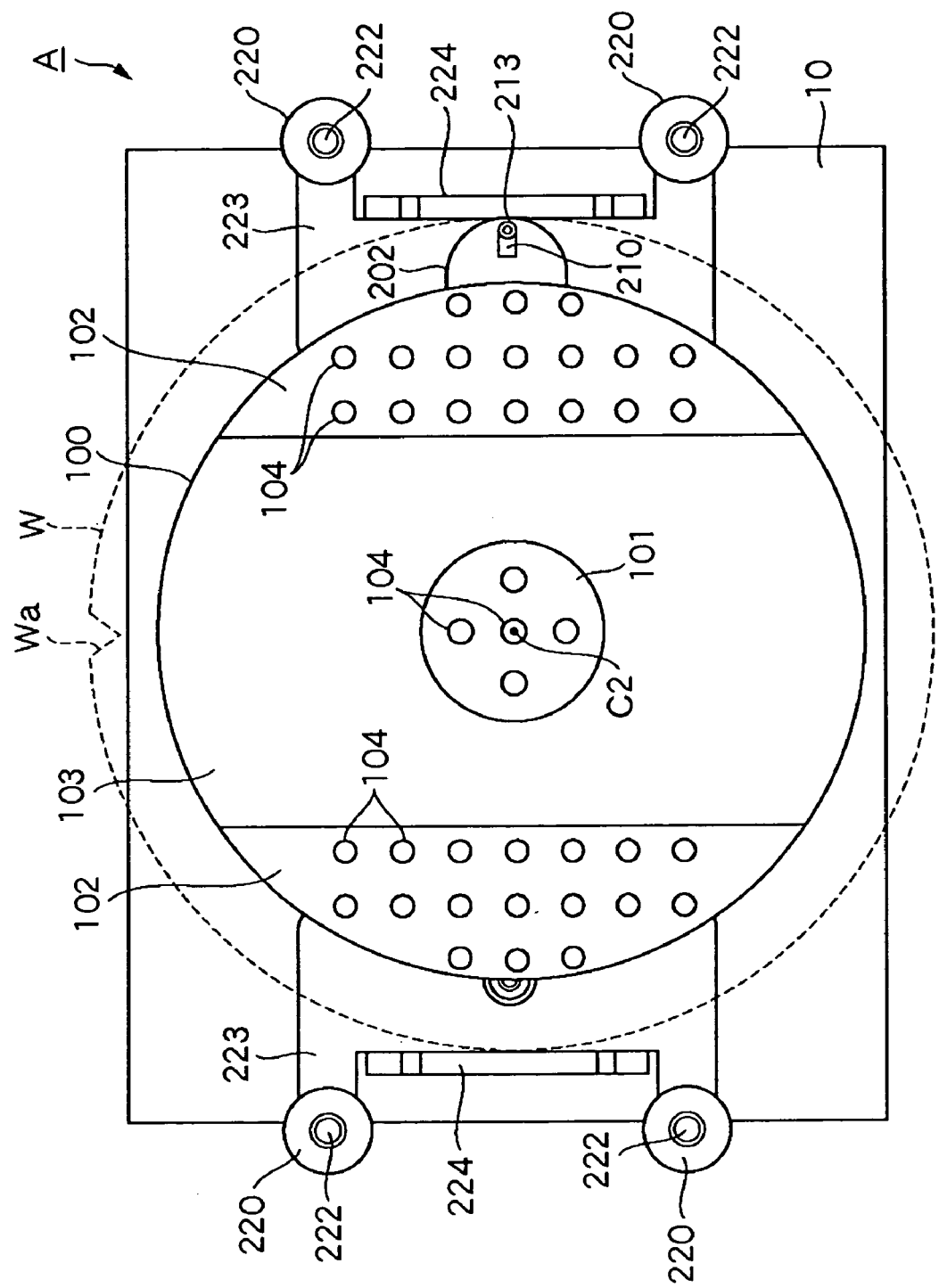
FIG. 1 is a plan view of a substrate aligning system A according to an embodiment of the present invention.
Figure 2:
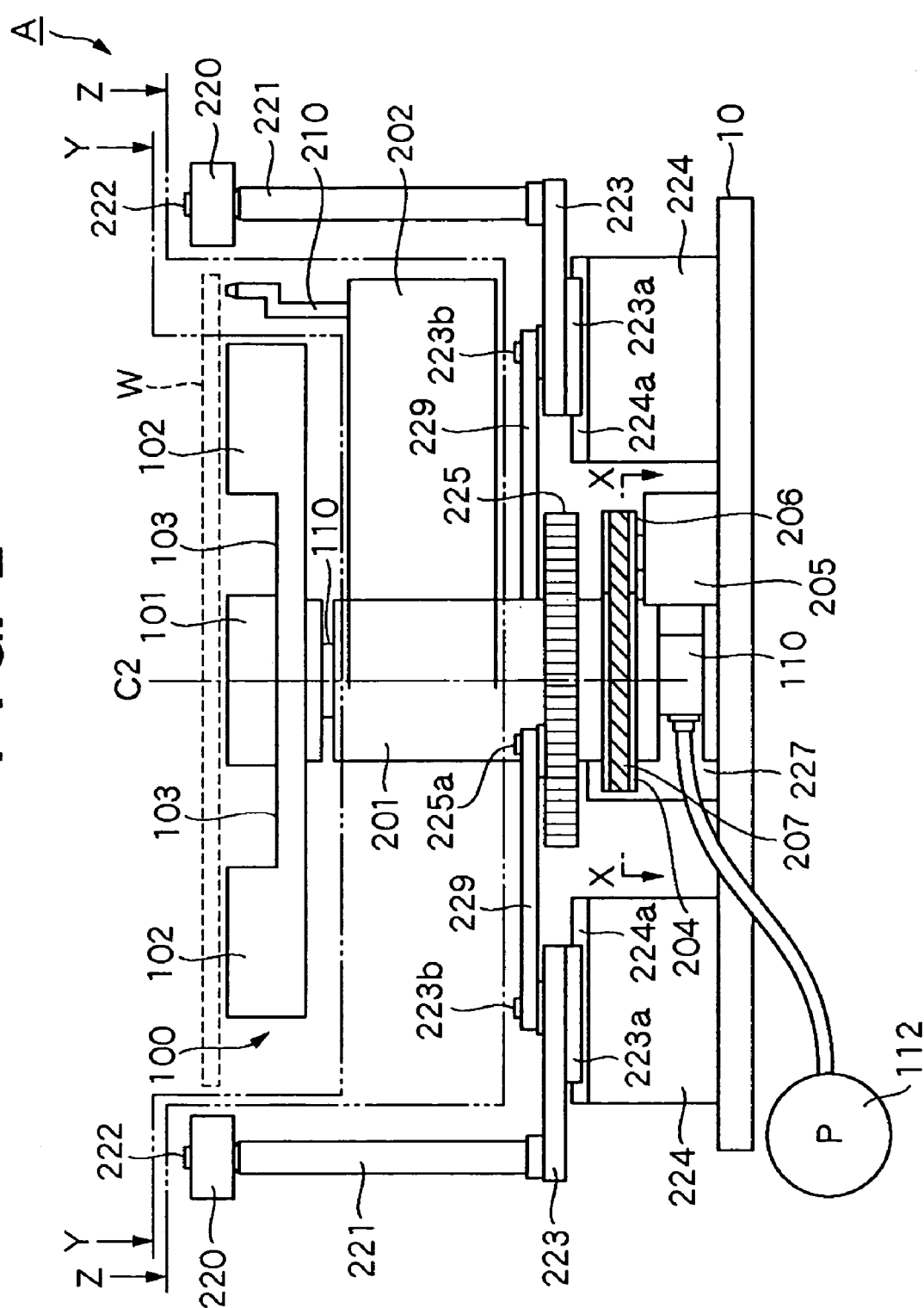
FIG. 2 is a front view of the substrate aligning system A.
Figure 3:
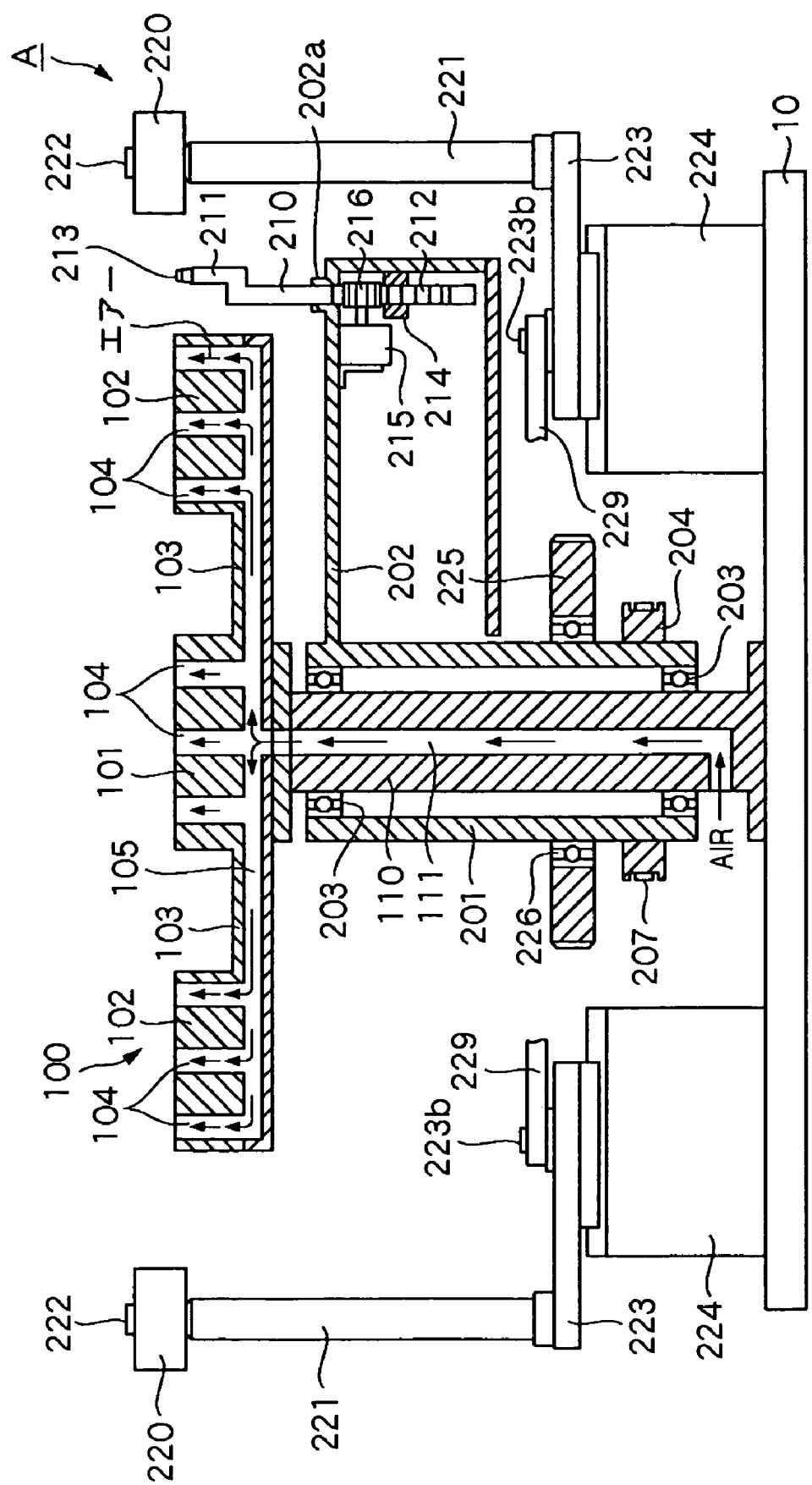
FIG. 3 is a view for schematically explaining the structure of the substrate aligning system A.
Figure 4:
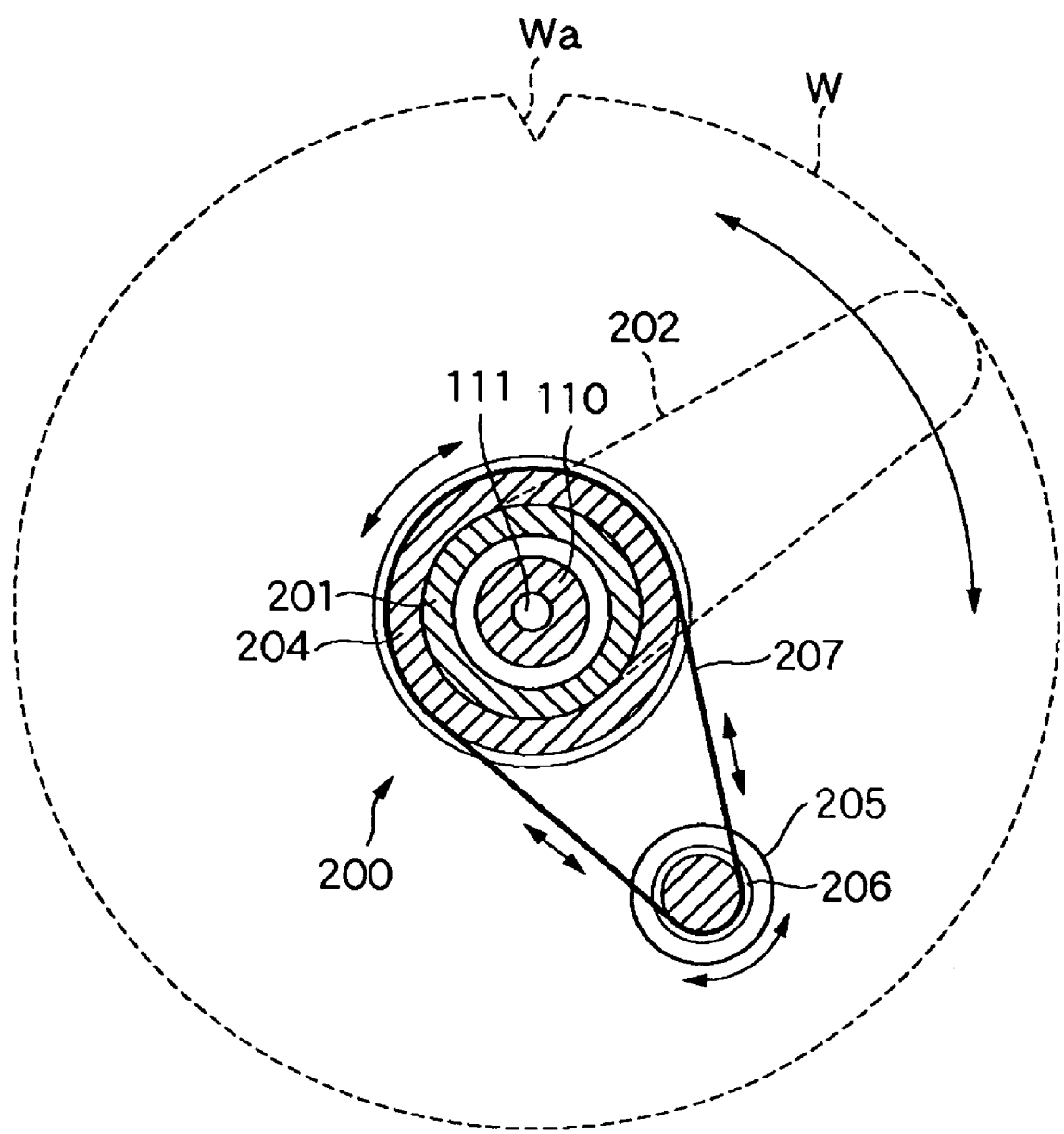
FIG. 4 is a (partially omitted) sectional view taken along the line X-X of FIG. 2.
Figure 14A:
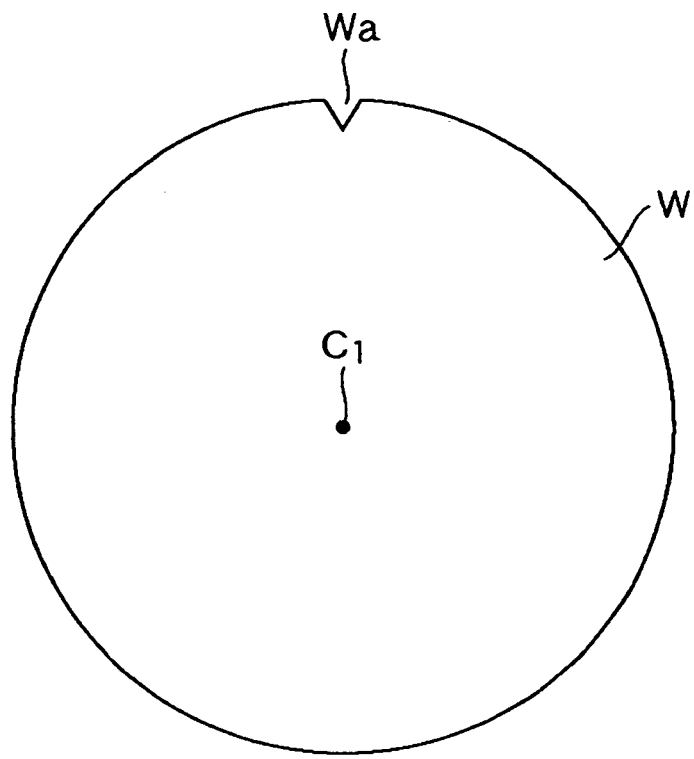
FIG. 14A is a view showing an example of the wafer W.
Figure 14B:
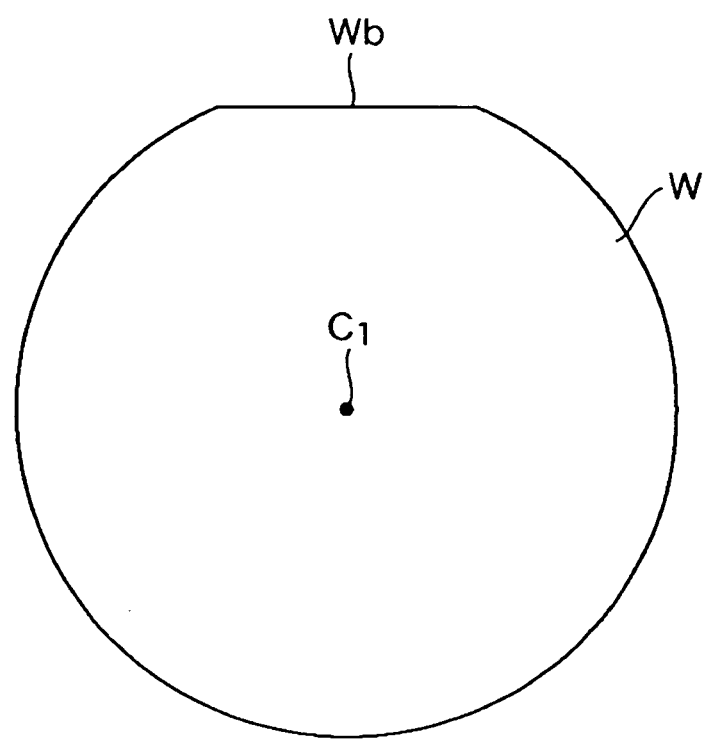
FIG. 14B is a view showing an example of the wafer W.

FIG. 1 is a plan view of a substrate aligning system A according to an embodiment of the present invention, FIG. 2 is a front view of the substrate aligning system A, and FIG. 3 is a view for schematically explaining the structure of the substrate aligning system A. The substrate aligning system A according to this embodiment is supposed to be used in the semiconductor manufacturing process, and is designed as a system which aligns a substrate (wafer W) when the substrate is to be transferred among semiconductor processing apparatuses. For example, the substrate aligning system A is provided to the wafer introducing portion of each semiconductor processing apparatus. FIGS. 14A and 14B are views showing examples of the wafer W. Generally, a wafer used in the semiconductor manufacturing process usually forms a circular thin plate, and has a chip in part of its peripheral portion to indicate its orientation. The types of chip are roughly classified into a V- or U-shaped chip Wa, as shown in FIG. 14A, which is called a notch, and a linear chip Wb, as shown in FIG. 14B, which is called an orientation flat. The substrate aligning system A can cope with both the chips. In this embodiment, a case will mainly be described wherein a wafer, shown in FIG. 14A, having a chip Wa called a notch is to be aligned.

A support mechanism for the wafer W in the substrate aligning system A will be described with reference to FIGS. 1 to 3. The substrate aligning system A has a support table 100 which supports the wafer W in noncontact manner with it. The support table 100 has an overall circular shape, and is supported as it is fixed to the upper end of a cylindrical support column 110 fixed to a base plate 10. The upper surface of the support table 100 has air injection portions 101 and 102 having a plurality of injection ports 104 to inject clean air, and a groove portion 103 where the arm of a transfer robot which transfers the wafer W onto the support table 100 enters horizontally. The air injection portion 101 is formed to have a circular section at the central portion of the support table 100. Two air injection portions 102 are formed symmetrically with respect to the center of the support table 100 to each cover a predetermined range of the peripheral portion of the support table 100. The air injection portions 101 and 102 have upper surfaces with substantially the same heights, and their upper surfaces are flat in the horizontal direction.

Each injection port 104 has a diameter of, e.g., about 0.5 mm to 1.0 mm, and is drawn in the drawings to be larger than it actually is. As shown in FIG. 3, a flow channel 105 for clean air to be injected from the injection ports 104 is formed in the support table 100. The flow channel 105 communicates with a flow channel 111 formed in the support column 110 along its axis. The flow channel 111 is connected to a pump 112 (see FIG. 2) at the lower end of the support column 110. The clean air fed from the pump 112 with pressure passes through the flow channels 111 and 105 and is injected from the injection ports 104.

The principle of supporting the wafer W by the support table 100 will be described. In this embodiment, the wafer W is supported by floating it by injection of the clean air. More specifically, when the clean air is injected from the injection ports 104, the wafer W is pushed upward and its weight balances with the pressure of the clean air, so that the wafer W is held in a floating state to be separate from the support table 100 by a predetermined distance (about 0.2 mm). In this case, when the injecting direction and injecting amount of the clean air are adjusted, the wafer W can be supported in a floating state by the Bernoulli method. Namely, while the wafer W is present on the support table 100, when clean air is injected from the injection ports 104, the wafer W is pushed upward. When the distance between the wafer W and the upper surface of the support table 100 (the upper surfaces of the air injection portions 101 and 102) increases to be equal to or larger than a predetermined value, a negative pressure is generated between the wafer W and the upper surface of the support table 100 to attract the wafer W to the support table 100. Hence, the wafer W is held in a floating state separate from the support table 100 by a predetermined distance. Although air floating and the Bernoulli method exemplify the present invention, any method can naturally be employed as far as it can support the wafer W in noncontact manner with it.

A rotary mechanism for the substrate processing apparatus A will be described. Put simply, according to the present invention, a center C1 (the center of a hypothetical circle with no chip) of a wafer W shown in FIG. 14 is set to coincide with an axis C2 of the support column 110 shown in FIGS. 1 and 2 so as to center the wafer W and rotate it, thus aligning its orientation. The structure of a moving unit which moves a contacting member (to be described later) will be described with reference to FIGS. 2 to 4 and FIG. 6.

A moving unit 200 includes a rotary portion 201 which is a cylinder concentric with the support column 110 and rotates about the axis C2 as the center of rotation, and an arm portion 202 which has an end connected to the rotary portion 201 and projects horizontally beside the rotary portion 201. The rotary portion 201 is rotatably attached to the support column 110 through bearings 203 at its upper and lower ends. A pulley 204 is fixed to the lower end side of the rotary portion 201. The moving unit 200 has a motor 205 to rotatably drive the rotary portion 201. The motor 205 is, e.g., a stepping motor, but can be another motor provided that its amount of rotation can be controlled. A pulley 206 is attached to the output shaft of the motor 205. An endless belt 207 is looped around the pulleys 204 and 206 to form a belt transmission mechanism. When the motor 205 is rotatably driven, the rotary portion 201 rotates about the axis C2 through the belt transmission mechanism, to pivot the arm portion 202 connected to the rotary portion 201. Although the belt transmission mechanism is used in this embodiment as a mechanism which rotatably drives the rotary portion 201, another transmission mechanism such as a gear mechanism may be used instead.

Figure 5A:
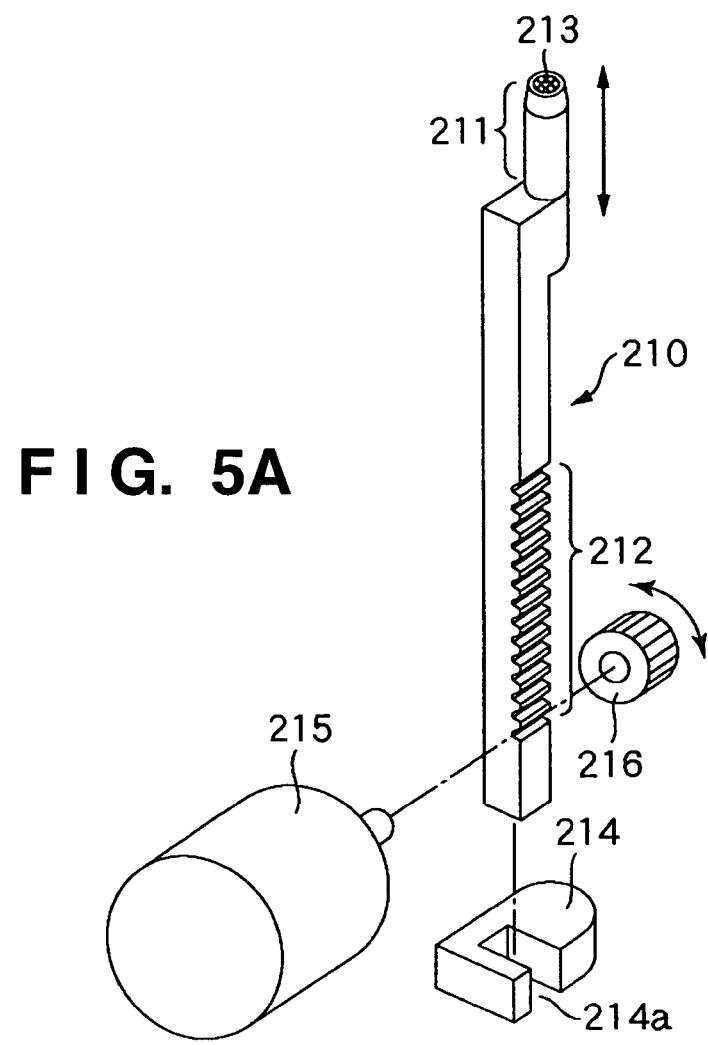
FIG. 5A is a view for explaining a contacting member 210 and its elevating mechanism.

The structure of the arm portion 202 will be described. One end of the arm portion 202 is connected to the rotary portion 201, and a contacting member 210 is attached to the other end of the arm portion 202. The arm portion 202 is hollow. An elevating mechanism which vertically (in the vertical direction) moves the contacting member 210 is incorporated in the arm portion 202 near the contacting member 210 side end. FIG. 5A is a view showing the structure of the contacting member 210 and that of its elevating mechanism. The contacting member 210 has a pin-shaped contacting portion 211 at its upper end side and a rack portion 212 formed in its side surface on the lower end side. The side surface of the contacting portion 211 contacts the edge of the chip Wa of the wafer W when the wafer W is rotated. The distal end of the contacting portion 211 forms a taper that decreases upward in diameter. A sensor 213 is attached to the upper end of the contacting portion 211. The sensor 213 detects the position of the chip Wa of the wafer W and is, e.g., a reflection type optical sensor. Note that the sensor 213 can be another sensor as far as it can detect the chip Wa.

The contacting member 210 with the above structure is attached to be movable only vertically as it is supported by a hole 202a (see FIG. 3) formed in the upper plate of the arm portion 202, and a guide member 214 which is attached in the arm portion 202 and has a groove 214a through which the contacting member 210 extends. The arm portion 202 incorporates a motor 215 and a pinion 216 attached to the output shaft of the motor 215. The motor 215 is, e.g., a stepping motor, but can be any motor as far as it can control the amount of rotation. The pinion 216 is disposed to mesh with the rack portion 212 of the contacting member 210. Therefore, when the motor 215 is rotated, the contacting member 210 moves vertically in accordance with the rotational direction of the motor 215. In this embodiment, a rack-pinion mechanism is employed as the elevating mechanism of the contacting member 210. Alternatively, another elevating mechanism such as a cam mechanism may be employed. As the power supply, another power supply other than a motor, e.g., an electromagnetic solenoid, may be employed.

Figure 5B:
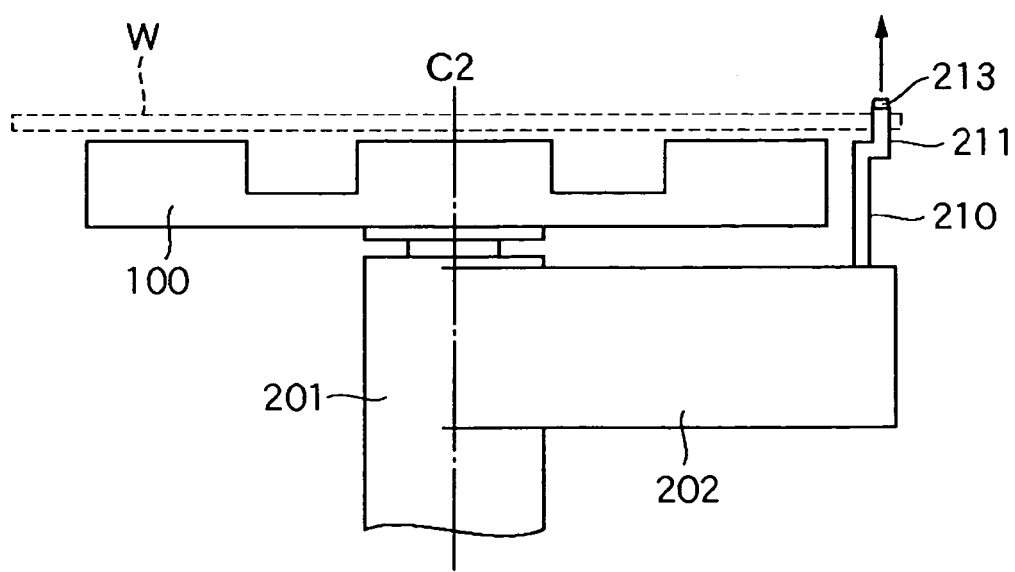
FIG. 5B is a view for explaining a case wherein the contacting member 210 is at a contacting position.

The state wherein the contacting member 210 is moved vertically will be described. In the normal state, as shown in FIG. 2, the upper end of the contacting member 210 is located under the wafer W, and the contacting portion 211 is located at a non-contacting position where it does not contact the edge of the chip Wa. When the wafer W is to be rotated, the motor 215 is rotated to move the contacting member 210 upward, so that the contacting portion 211 moves to a contacting position where it contacts the edge of the chip Wa, as shown in FIG. 5B. At this time, as shown in FIG. 5C, the contacting portion 211 is sandwiched by edges E1 and E2 on the two sides in the circumferential direction of the chip Wa. In this state, when the arm portion 202 is pivoted to move the contacting member 210, the contacting portion 211 contacts either the edge E1 or E2 in accordance with the moving direction of the contacting member 210 to press the edge E1 or E2, so as to supply a rotation force to the wafer W by the pivotal motion of the contacting portion 211. In order to obtain this function, the contacting portion 211 is arranged within a distance corresponding to the radius of the wafer W from the axis C2, at such a position where it can enter the chip Wa.

The size (diameter) of the contacting portion 211 is desirably set to a value that can regulate the free rotation of the wafer W. Namely, the contacting portion 211 desirably regulates the wafer W so the wafer W will not rotate when the contacting member 210 moves and stops. For example, in the example of FIG. 5C, assume that the contacting portion moves to the edge E1 side and stops there. In this case, if the diameter of the contacting portion 211 is small, the wafer W may undesirably rotate by an amount corresponding to the gap between the contacting portion 211 and edge E2. Hence, the diameter of the contacting portion 211 is preferably set as large as possible so when it enters the chip Wa, it may substantially contact both the edges E1 and E2. Then, the wafer W is prevented from rotating, but can be rotated at a higher speed and stopped, thus decreasing the aligning time.

Ideally, the diameter of the contacting portion 211 is set such that the contacting portion 211 contacts both the edges E1 and E2 tightly. If the diameter of the contacting portion 211 is increased, when the contacting portion 211 is to enter the chip Wa, the upper end of the contacting member 210 may interfere with the wafer W. To prevent this, the upper end of the contacting portion 211 is tapered, as in this embodiment, to decrease this interference. Also, a mechanism may be added which moves the contacting portion 211 not only vertically but also horizontally in the direction of radius of the wafer W. If this mechanism is added, when the contacting portion 211 is to enter the chip Wa, it is moved upward at a position where the width between the edges E1 and E2 on the outer side in the direction of radius of the wafer W is larger. After that, the contacting portion 211 is moved to the inner side in the direction of radius where the width between the edges E1 and E2 is smaller. Then, the contacting portion 211 can tightly contact both of the edges E1 and E2. As the contacting portion 211 can be made smaller, the interference described above can be avoided.

In this embodiment, the contacting portion 211 is pin-shaped. However, the shape of the contacting portion 211 is not limited to this, but can employ various shapes that regulate the free rotation of the wafer W. For example, the contacting portion 211 can have a triangular section to match the shape of the chip Wa. In this embodiment, the contacting member 210 is moved vertically. Alternatively, the contacting member 210 may be fixed, and the support table 100 may be moved vertically to move the wafer W side vertically. Also, the contacting member 210 may be fixed to the arm portion 202, and the arm portion 202, or the arm portion 202 and rotary portion 201, may be moved vertically.

A structure will be described which regulates parallel movement of the wafer W in the horizontal direction, when the wafer W is to be rotated by the movement of the contacting member 210, so the wafer W rotates with substantially no eccentricity such that its center C1 coincides with the axis C2.

Referring to FIGS. 1 to 3, the substrate aligning system A according to this embodiment is provided with four rollers 220 as a defining means which defines the position of the peripheral portion of the wafer W so that the center C1 of the wafer W coincides with the axis C2. The rollers 220 are respectively, rotatably supported by shafts 222 provided to the upper ends of four support columns 221. The rollers 220 are disposed at such portions that they are located beside the wafer W when the wafer W is supported by the support table 100.

Figure 7A:
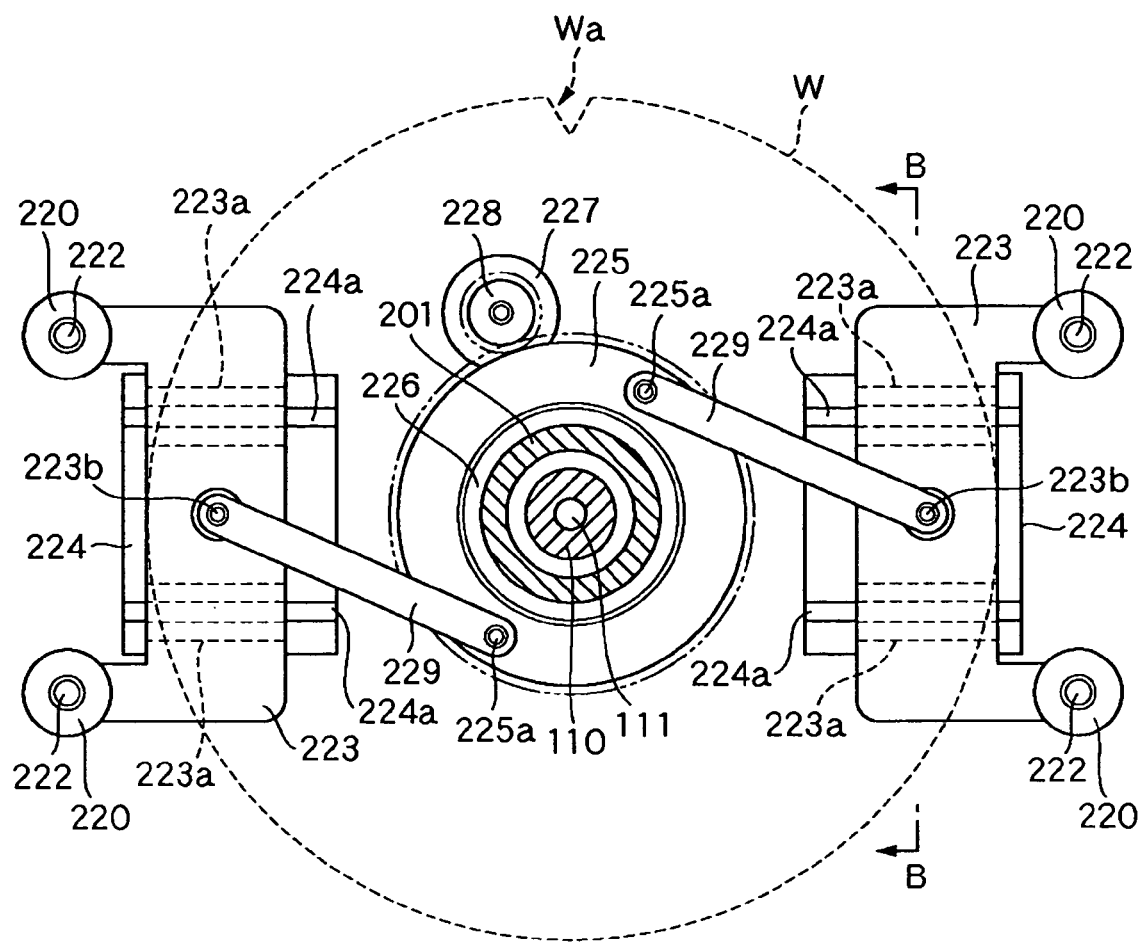
FIG. 7A is a (partially omitted) sectional view taken along the line Z-Z of FIG. 2.
Figure 7B:
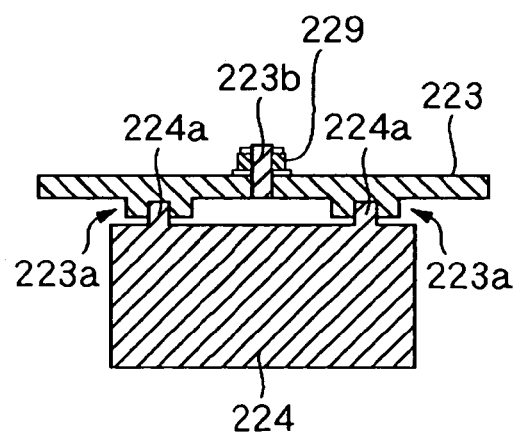
FIG. 7B is a (partially omitted) sectional view taken along the line B-B of FIG. 2.

The four support columns 221 include two standing upward from one of two moving plates 223 and another two standing upward from the remaining one of the two moving plates 223. Each moving plate 223 is movably supported on a corresponding support table 224 fixed on the base plate 10. Referring to FIGS. 7A and 7B, two linear guide rails 224*a* are arranged on each support table 224, and two rows of linear grooves 223*a* to be guided by the guide rails 224*a* are formed in the lower surface of each moving plate 223. Each moving plate 223 is guided by the guide rails 224*a* to move toward or away from the support column 110. As the moving plates 223 move, the rollers 220 move toward or away from the wafer W supported on the support table 100.

A driving mechanism which moves the moving plates 223 will be described. Referring to FIGS. 7A and 3, a gear 225 is attached to the lower end side of the rotary portion 201. The gear 225 is attached to the rotary portion 201 through a bearing 226, and can rotate independently of the rotary portion 201. The gear 225 meshes with a gear 228 attached to the output shaft of a motor 227, and is rotated as the motor 227 rotates. The motor 227 can be, e.g., a stepping motor, but can be any motor as far as it can control the amount of rotation. Although a gear mechanism is employed in this embodiment, another transmission mechanism, e.g., a belt transmission mechanism, may be employed.

The gear 225 is connected to the respective moving plates 223 through links 229. Two pins 225*a* stand vertically from the upper surface of the gear 225 to be symmetrical with respect to the axis C2. One end of each link 229 is pivotally, axially supported by the corresponding pin 225*a*. The other end of each link 229 is pivotally, axially supported by a pin 223*b* standing vertically from the corresponding moving plate 223. The two links 229 have the same lengths. When the gear 225 rotates, the moving plates 223 move in opposite directions for the same distance in accordance with the amount of rotation of the gear 225.

Figure 8A:
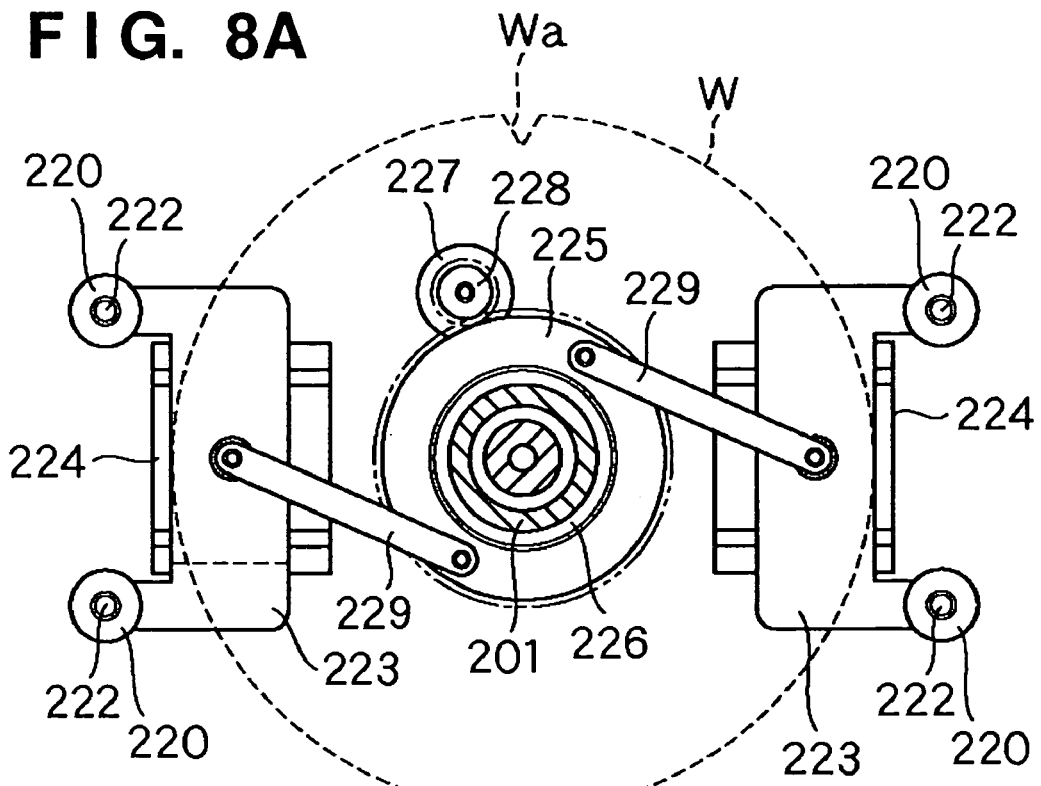
FIG. 8A is a view showing a state wherein rollers 220 are retreated from a wafer W.
Figure 8B:
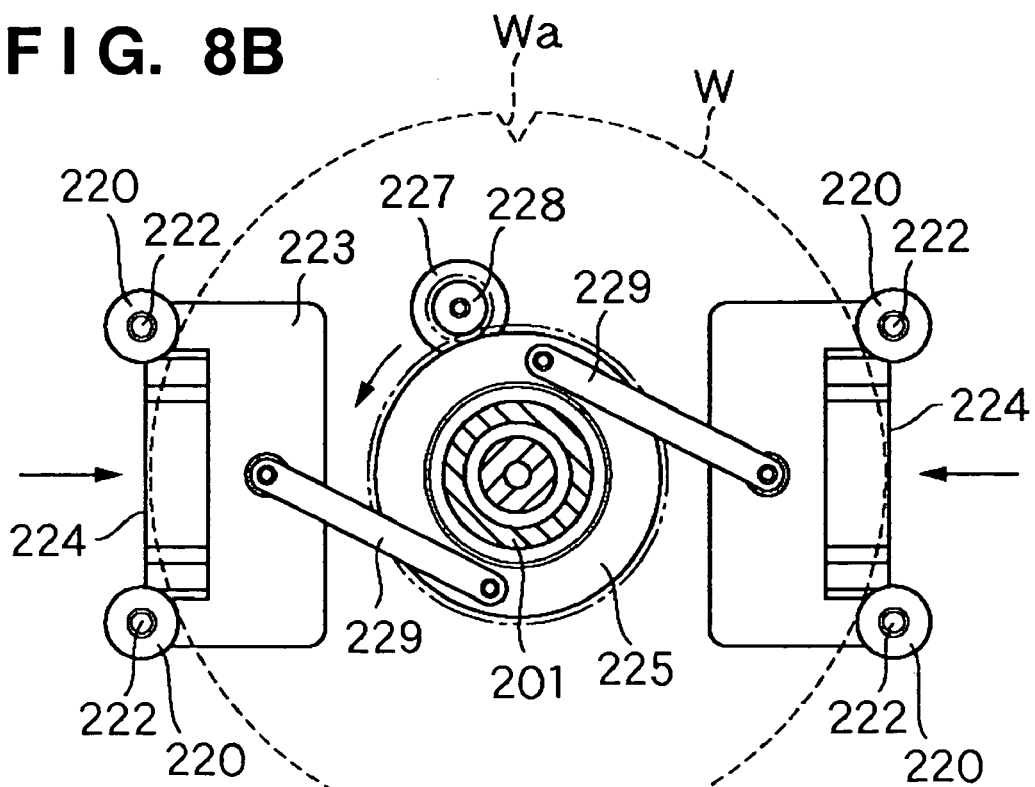
FIG. 8B is a view showing a case wherein the rollers 220 are at positions to contact the wafer W.

The operation of the rollers 220 to define the position of the peripheral portion of the wafer W will be described with reference to FIGS. 8A and 8B. FIG. 8A shows a state wherein the four rollers 220 have retracted from the wafer W supported on the support table 100 and are located at the standby positions separate from the peripheral portion of the wafer W. In this state, when the motor 227 is rotated in a predetermined direction for a predetermined amount, the gear 225 rotates counterclockwise through the gear 228. When the gear 225 rotates counterclockwise, the respective moving plates 223 move in response for predetermined amounts toward the support column 110 through the links 229. Consequently, the respective rollers 220 move for predetermined amounts toward the wafer W, and stop at the positions shown in FIG. 8B. FIG. 8B shows a case wherein the four rollers 220 are located at aligning positions where they contact the peripheral portion of the wafer W supported on the support table 100.

When the respective rollers 220 move from the positions of FIG. 8A to the positions of FIG. 8B, the peripheral portion of the wafer W supported on the support table 100 is pressed by the respective rollers 220 from different points in different directions toward the axis C2, so that the wafer W is aligned with a position where its center C1 coincides with the axis C2. In this aligned state, when the contacting portion 211 of the contacting member 210 described above enters the chip Wa and the contacting member 210 moves, the position of the peripheral portion of the wafer W is defined by the respective rollers 220, and the parallel movement of the wafer W in the horizontal direction is regulated. Thus, the wafer W rotates while its center C1 coincides with the axis C2.

The center of a circle is determined when three points on its circumference are determined. Accordingly, when at least three rollers 220 are provided, the central position of the wafer W can be aligned with the axis C2. As the wafer W has the chip Wa, however, when one roller 220 happens to contact the chip Wa, sometimes accurate alignment cannot be performed. In view of this, according to this embodiment, since the four rollers 220 are provided, even if any one roller 220 contacts the chip Wa, the remaining three rollers 220 can align the center of the wafer W.

In FIG. 8B, the respective rollers 220 are desirably disposed at such positions that a very small gap is formed between some roller 220 and the peripheral portion of the wafer W, rather than they contact the peripheral portion of the wafer W completely. Although the rotatable rollers 220 are employed as the defining means in this embodiment, another type of members, e.g., pins having smooth surfaces, can be used instead. Although all of the four rollers 220 are movable in this embodiment, some roller 220 may be fixed while the remaining rollers 220 may be movable. In this embodiment, the moving plates 223 are moved by using the gear mechanism and link mechanisms to move the rollers 220. The mechanism that moves the rollers 220 is not limited to this, and various types of mechanisms can be employed.

<Operation of System>

The operation of the substrate aligning system A having the above arrangement will be described with reference to FIGS. 9 to 11. When the wafer W is transferred to the substrate aligning system A, the substrate aligning system A is controlled by a controller (not shown) to operate in the following manner.

Figure 9A:
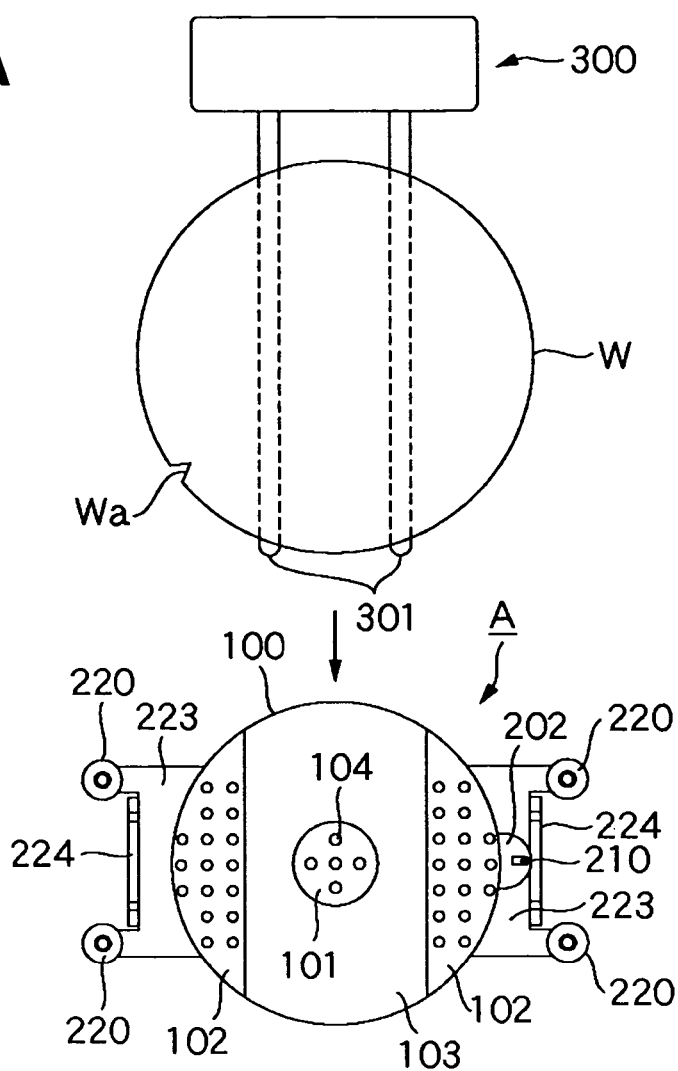
FIG. 9A is a view for explaining the operation of the substrate aligning system A.
Figure 9B:
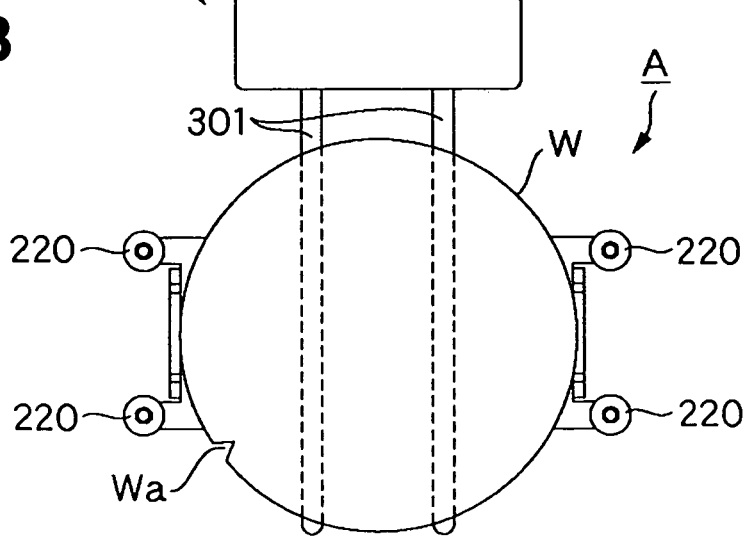
FIG. 9B is a view for explaining the operation of the substrate aligning system A.

FIGS. 9A and 9B are views showing a state wherein the wafer W is to be transferred to the substrate aligning system A. As shown in FIG. 9A, the wafer W which has been processed by a certain processing apparatus is held on hand portions 301 of an arm 300 of a transfer device and transported to the substrate aligning system A. The hand portions 301 have air vacuum ports in, e.g., their upper surfaces. The wafer W is held as it is attracted by the upper surfaces of the hand portions 301.

When the wafer W is to be transported, the rollers 220 are set at the standby positions while the contacting member 210 is set at the non-contacting position. As shown in FIG. 9A, the arm 300 transfers the wafer W onto the support table 100 from beside the substrate aligning system A such that its hand portions 301 enter the groove portion 103 of the support table 100. In the transfer, usually, the center C1 of the wafer W does not coincide with the axis C2 of the substrate aligning system A, and the position of the chip Wa varies. In this embodiment, the arm 300 is exemplified by one which holds the wafer W on its hand portions 301. However, the transfer device which transports the wafer W is not limited to this. For example, a transfer device of another type, e.g., a clamp type device which clamps the peripheral portion of the wafer W from above the wafer W, can be employed. In the transfer of the wafer W, if part of the transfer device does not interfere with the support table 100, as with the clamp type device, the groove portion 103 is not always necessary.

Figure 10A:
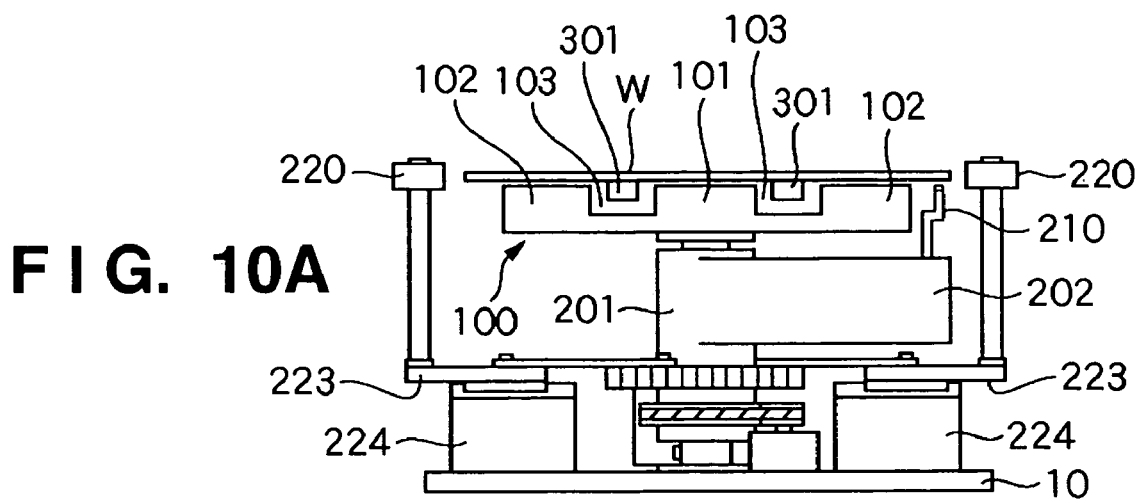
FIG. 10A is a view for explaining the operation of the substrate aligning system A.
Figure 10B:
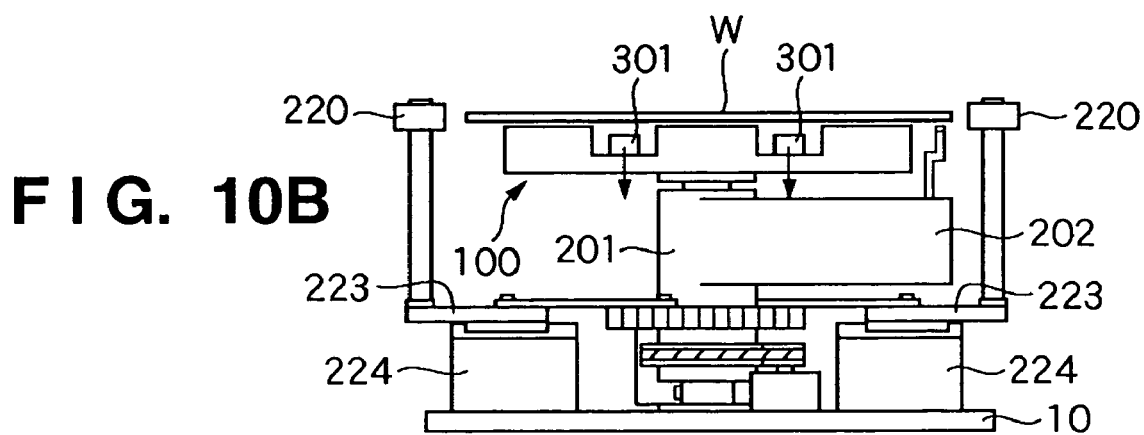
FIG. 10B is a view for explaining the operation of the substrate aligning system A.

FIGS. 9B and 10A are views showing a state wherein the hand portions 301 of the arm 300 enter the groove portion 103 of the support table 100 and the wafer W is located above the support table 100. In this state, first, the pump 112 is operated to start injecting the clean air from the injection ports 104 of the air injection portions 101 and 102. Injection of the clean air continues until the respective operations to be described below are ended. Then, as shown in FIG. 10B, the hand portions 301 of the arm 300 move downward, and the support table 100 replaces the hand portions 301 to support the wafer W in a floating state. Having transferred the wafer W, the arm 300 is temporarily retracted from the substrate aligning system A.

Figure 11A:
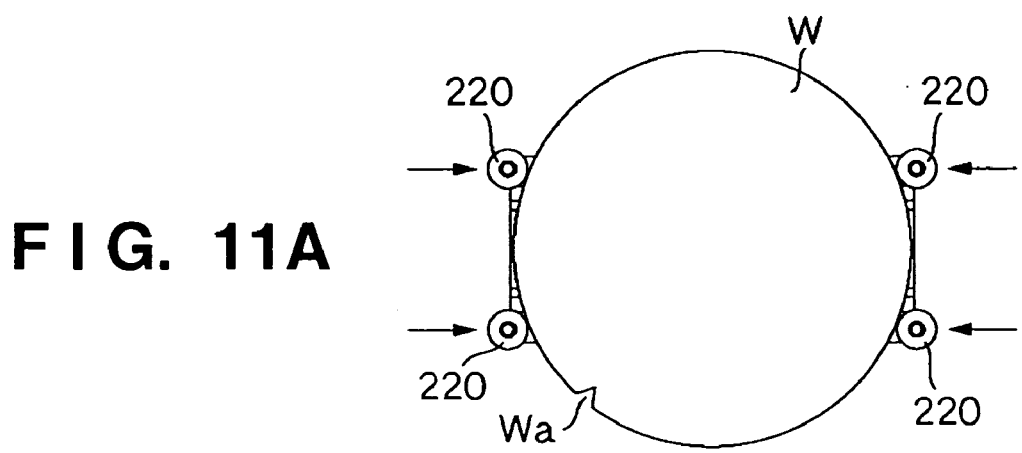
FIG. 11A is a view for explaining the operation of the substrate aligning system A.

Subsequently, in the substrate aligning system A, the motor 227 is driven to move the respective rollers 220 from the standby positions to the aligning positions, as shown in FIG. 11A, so as to align the center of the wafer W. As a result, the center C1 of the wafer W coincides with the axis C2 of the substrate aligning system A.

Figure 11B:
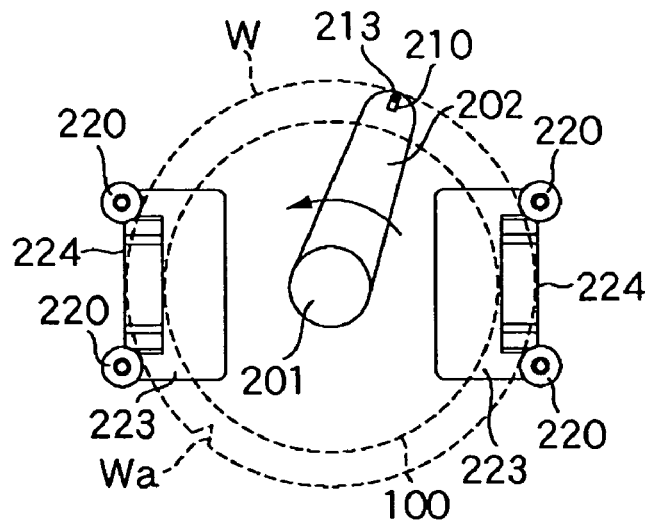
FIG. 11B is a view for explaining the operation of the substrate aligning system A.

When alignment of the center of the wafer W is ended, a step of detecting the position of the chip Wa of the wafer W is performed. In this case, as shown in FIG. 11B, while the contacting member 210 is located at the non-contacting position, the motor 205 is driven to rotate the rotary portion 201, so as to pivot the arm portion 202 about the axis C2. Then, the sensor 213 arranged at the upper end of the contacting member 210 moves along the peripheral portion of the wafer W to scan the peripheral portion. The entire length of the arm portion 202 is set not to interfere with the rollers 220 located at the aligning positions.

Figure 11C:
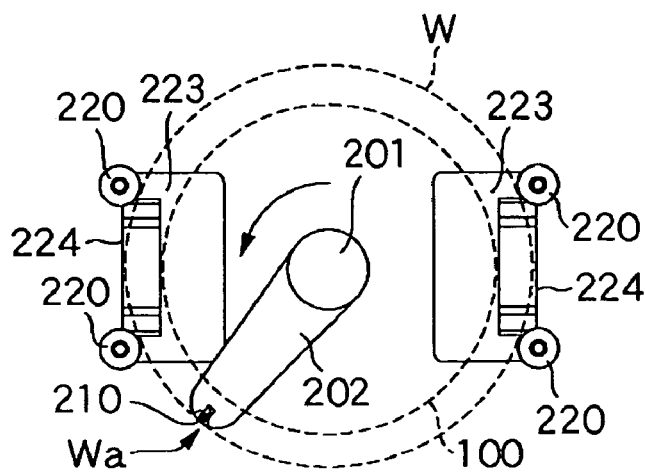
FIG. 11C is a view for explaining the operation of the substrate aligning system A.

When the sensor 213 detects the chip Wa of the wafer W, the motor 205 is stopped to stop the pivotal motion of the arm portion 202, so that the contacting portion 211 of the contacting member 210 is located immediately under the chip Wa, as shown in FIG. 11C. If the sensor 213 passes the chip Wa, the motor 205 is reversed to pivot the arm portion 202 in the reverse direction, so that the contacting portion 211 of the contacting member 210 is adjusted to be located immediately under the chip Wa. In this embodiment, the sensor 213 which detects the position of the chip Wa is provided to the contacting member 210. Thus, alignment of the contacting portion 211 and chip Wa and detection of the position of the chip Wa can be performed substantially simultaneously. The aligning time is shortened, and both the contacting portion 211 and sensor 213 can be moved by a common driving mechanism. Thus, the system can be further simplified.

Figure 11D:
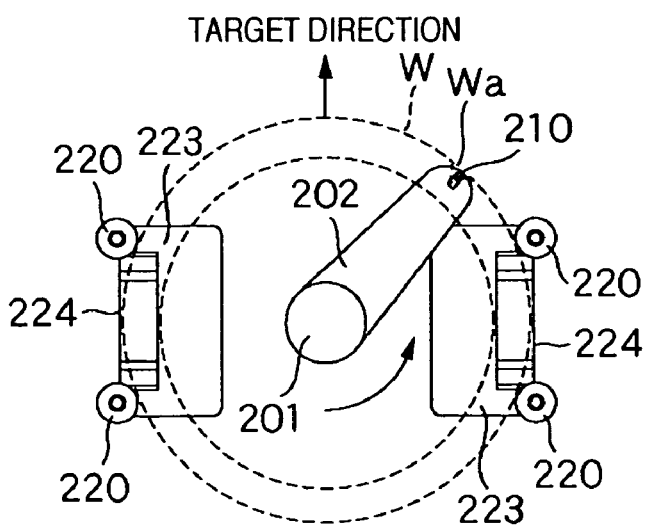
FIG. 11D is a view for explaining the operation of the substrate aligning system A.
Figure 11E:
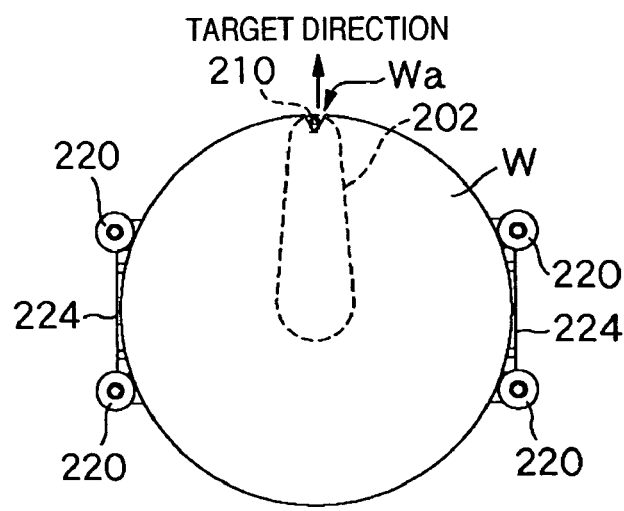
FIG. 11E is a view for explaining the operation of the substrate aligning system A.

Then, the motor 215 is driven to move the contacting member 210 upward from the non-contacting position to the contacting position. The contacting portion 211 of the contacting member 210 enters the chip Wa to be able to contact the edge of the chip Wa. Successively, the motor 205 is driven to pivot the arm portion 202 as shown in FIG. 11D. Consequently, the contacting portion 211 pivots while pressing the edge of the chip Wa, thereby rotating the wafer W. In this case, as the respective rollers 220 are located at the aligning positions, the wafer W rotates while its center is kept aligned. The arm portion 202 pivots until the chip Wa of the wafer W is set in a predetermined target direction. When the chip Wa of the wafer W is soon set in the predetermined target direction, as shown in FIG. 11E, the motor 205 is stopped to stop the pivotal motion of the arm portion 202. Thus, center alignment and orientation adjustment of the wafer W are ended.

After that, the hand portions 301 of the arm 300 enter the groove portion 103 of the support table 100 again to hold the wafer W. Subsequently, the motor 215 is driven to move the contacting member 210 downward from the contacting position to the non-contacting position. Simultaneously, the motor 227 is driven to move the rollers 220 from the aligning positions to the standby positions. The hand portions 301 of the arm 300 lift up the wafer W. Thus, the wafer W is received from the substrate aligning system A, and transported to the next step. When the wafer W is transported, the operation of the pump 112 is stopped, and injection of the clean air from the injection ports 104 is also stopped.

In this manner, in the substrate aligning system A according to this embodiment, first, the wafer W is supported by the support table 100 in a noncontact manner to prevent particles or the like from attaching to the wafer W. The contacting portion 211 of the contacting member 210 contacts the edge of the chip Wa of the wafer W and pivoted to press the edge, thus rotating the wafer W. The wafer W can be rotated reliably to improve the accuracy of the amount of rotation. While the contacting member 210 and rollers 220 contact the wafer W, they do so at the end edge of the wafer W, and do not damage the upper or lower surface of the wafer W. Furthermore, when detecting the position of the chip Wa of the wafer W and rotating the wafer W, the wafer W need not be reheld. Thus, the orientation of the wafer can be adjusted accurately within a short period of time.

<Other Embodiment>

Figure 12A:
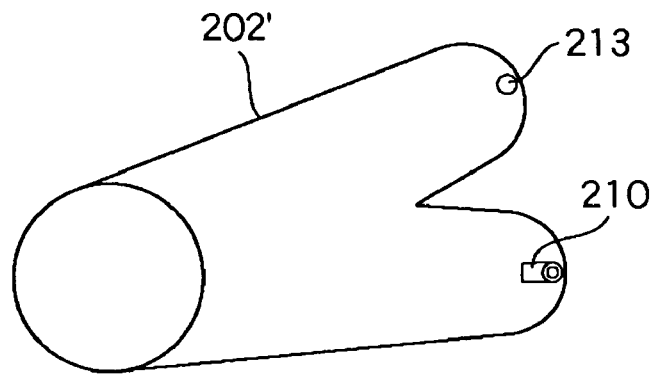
FIG. 12A is a view for explaining a modification of the substrate aligning system A.

While the contacting member 210 is provided with the sensor 213 in the above embodiment, they can be separately arranged. FIG. 12A is a view showing an example of this, in which an arm portion 202' replaces the arm portion 202. The arm portion 202' is Y-shaped and has two distal ends where a sensor 213 and contacting member 210 are disposed respectively. When this arm portion 202' is employed, the sensor 213 detects a chip Wa, and after that an contacting portion 211 of the contacting member 210 and a chip Wa are aligned by the pivotal motion of the arm portion 202'. If the distance (distance in the circumferential direction of a wafer W) between the sensor 213 and contacting member 210 is set to match the distance through which the sensor 213 overruns, until stopping, from the position where it detects the chip Wa, the efficiency is naturally further improved.

Figure 12B:
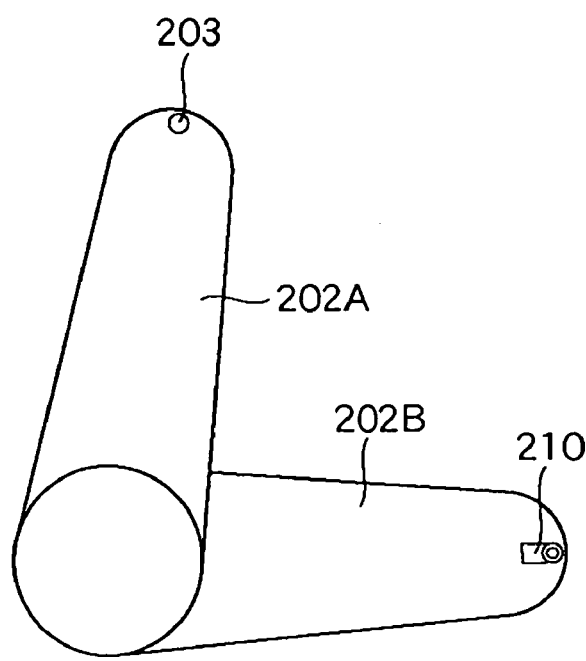
FIG. 12B is a view for explaining a modification of the substrate aligning system A.

FIG. 12B shows still another example of the arm portion 202. Arm portions 202A and 202B which pivot independently of each other are provided. The arm portion 202A is provided with a sensor 203, and the arm portion 202B is provided with an contacting member 210. In this arrangement example, the arm portion 202A is pivoted to detect a chip Wa with the sensor 203. After that, the arm portion 202B is pivoted to align a contacting portion 211 of the contacting member 210 with the chip Wa. The respective arm portions 202A and 202B require independent driving mechanisms.

The substrate aligning system A described above can be applied to the wafer W shown in FIG. 14B which has the orientation flat-type chip Wb as well as to the wafer W having the notched chip Wa. The orientation-flat-type chip Wb has a linear edge. If the contacting portion 211 of the contacting member 210 only contacts the edge at one portion in point contact, when the contacting portion 211 stops moving, the wafer W may sometimes slightly, freely rotate by the inertia.

In view of this, for example, the contacting portion 211 may have a planar contacting surface of, e.g., a square section rather than the circular section of this embodiment, to conform to the linear edge. When the contacting portion 211 contacts the edge by line (or surface) contact, free rotation of the wafer W by the inertia can be regulated.

Figure 13A:
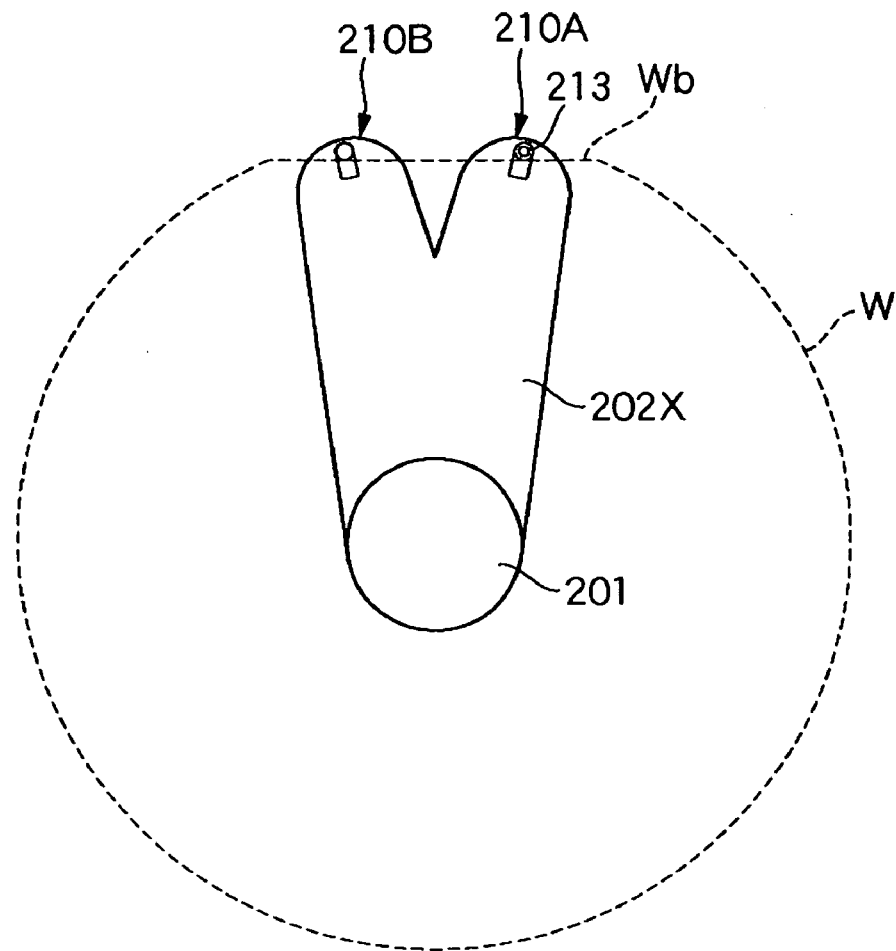
FIG. 13A is a view for explaining a modification of the substrate aligning system A.
Figure 13B:
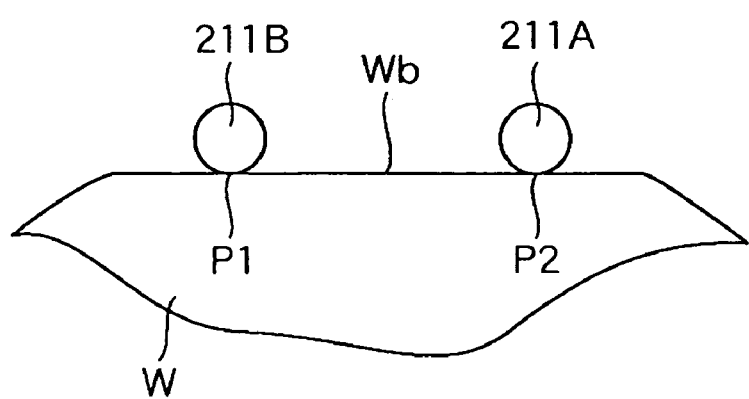
FIG. 13B is a view for explaining a modification of the substrate aligning system A.

Even when the contacting portion 211 has a circular section and comes into contact with the edge of the chip Wb by point contact, if the plurality of contacting portions 211 are provided separate from each other to contact the edge of the chip Wb at a plurality of portions, free rotation of the wafer W by the inertia can be regulated. FIG. 13A is a view showing such an arrangement example. In the example of FIG. 13A, a Y-shaped arm portion 202X is employed in place of the arm portion 202. The two distal ends are respectively provided with contacting members 210A and 210B. While both the contacting members 210A and 210B are provided with the respective elevating mechanisms, one sensor 213 suffices for the two contacting members 210A and 210B. In the example of FIG. 13A, the sensor 213 is provided to the contacting member 210A. Naturally, the sensor 203 may be disposed at a portion other than the contacting member 210A or 210B. In the arrangement of FIG. 13A, contacting portions 211A and 211B of the contacting members 210A and 210B contact the edge of a chip Wb at two portions P1 and P2 which are separate from each other, as shown in FIG. 13B. The contacting portion 211A regulates counterclockwise rotation of a wafer W, and the contacting portion 211B regulates clockwise rotation of the wafer W, thus regulating free rotation of the wafer W.

Figure 15:
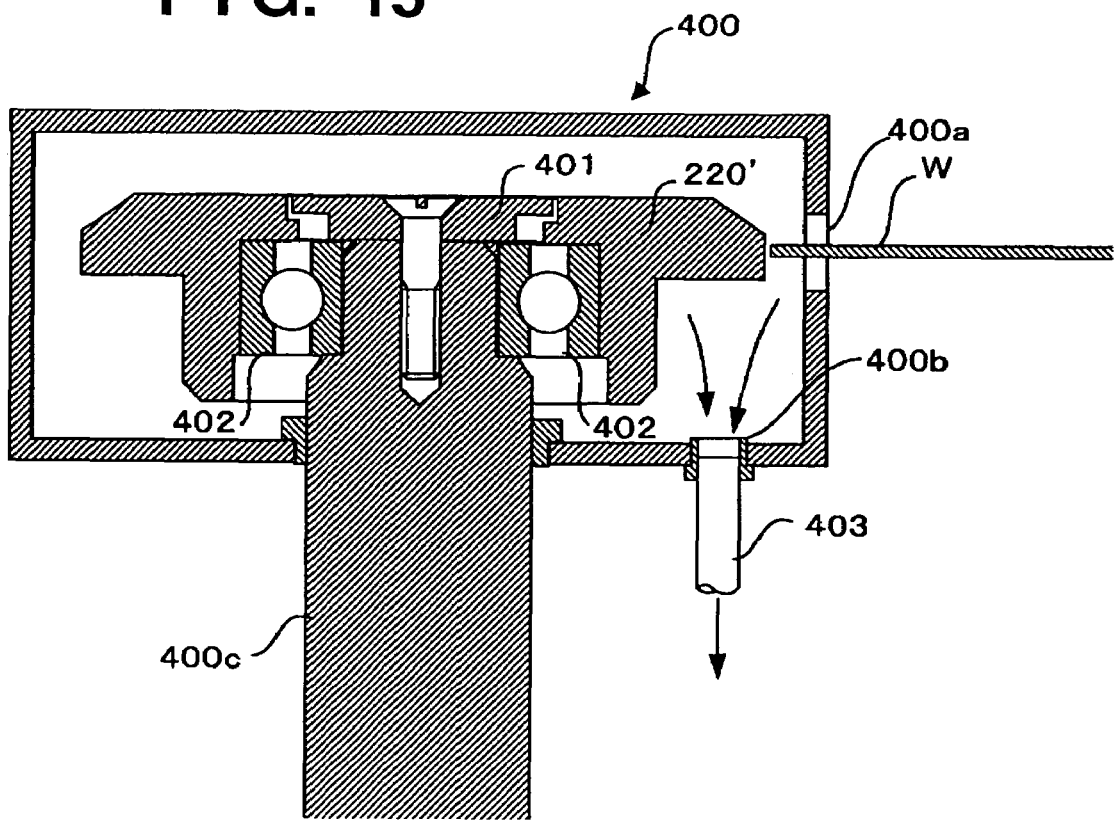
FIG. 15 is a sectional view showing the structure of an example wherein a roller is provided with a cover member 400.

In the above embodiment, when the wafer W is to be rotated while the position of its peripheral portion is defined by the rollers 220, as the rollers 220 come into contact with the peripheral portion of the wafer W, sometimes scatter of particles or the like may occur. In this case, cover members may be provided to the respective rollers 220 individually, thus preventing scatter of particles the like. FIG. 15 is a sectional view showing the structure of an example wherein each roller is provided with a cover member 400. In the example of FIG. 15, in place of the rollers 220, rollers 220' having shapes slightly different from those of the rollers 220 are employed. Each roller 220' is rotatably attached to a support column 221 through a ball bearing 402 fitted on the upper end of the support column 221. A stopper 401 is fixed to the upper end face of the support columns 221 with a bolt and regulates upward movement of the roller 220'.

The cover member 400 is a hollow body which surrounds the roller 220', and fixed to the upper end of the support column 221. The cover member 400 has a slit 400a through which the peripheral portion of a wafer W passes, an exhaust port 400b to externally discharge air in the cover member 400, and a hole 400c through which the support column 221 extends, and is fixed to the support column 221 at the hole 400c. As the cover member 400 is fixed to the support column 221, it is moved together with the roller 220' by the moving unit 200.

The slit 400a is set to such a size that the peripheral portion of the wafer W can pass through it. The wafer W passes through the slit 400a and contacts the outer surface of the roller 220' so that the position of the wafer W is defined. The exhaust port 400b is connected to one end of a pipe 403. The other end of the pipe 403 is connected to a vacuum device (not shown) such as a pump. The vacuum device draws in air in the cover member 400.

When the wafer W is rotated while the position of its peripheral portion is defined by the rollers 220', even if particles or the like scatters as the rollers 220' come into contact with the peripheral portion of the wafer W, the cover members 400 prevent the particles or the like from scattering externally. When air in the cover members 400 is drawn by the vacuum device (not shown), the particles or the like in the cover members 400 is discharged through the exhaust ports 400b. The vacuum device generates a negative pressure in the cover members 400. Thus, the particles or the like will not scatter externally through the slits 400a.

<Other Embodiment of Substrate Alignment>

Figure 16:
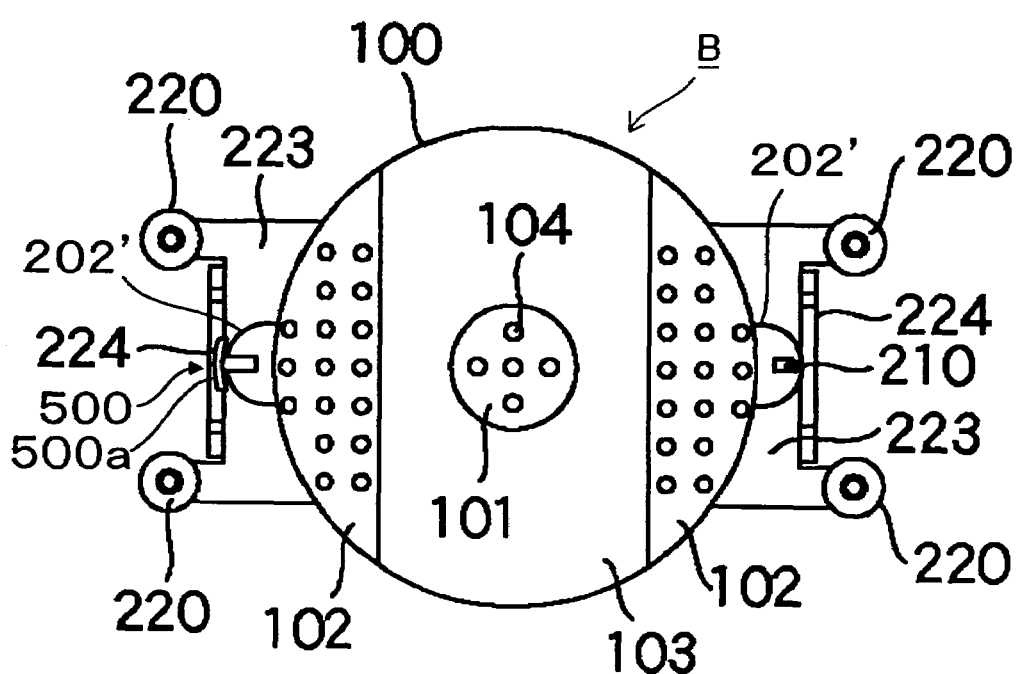
FIG. 16 is a schematic plan view of a substrate aligning system B according to another embodiment of the present invention.
Figure 17:
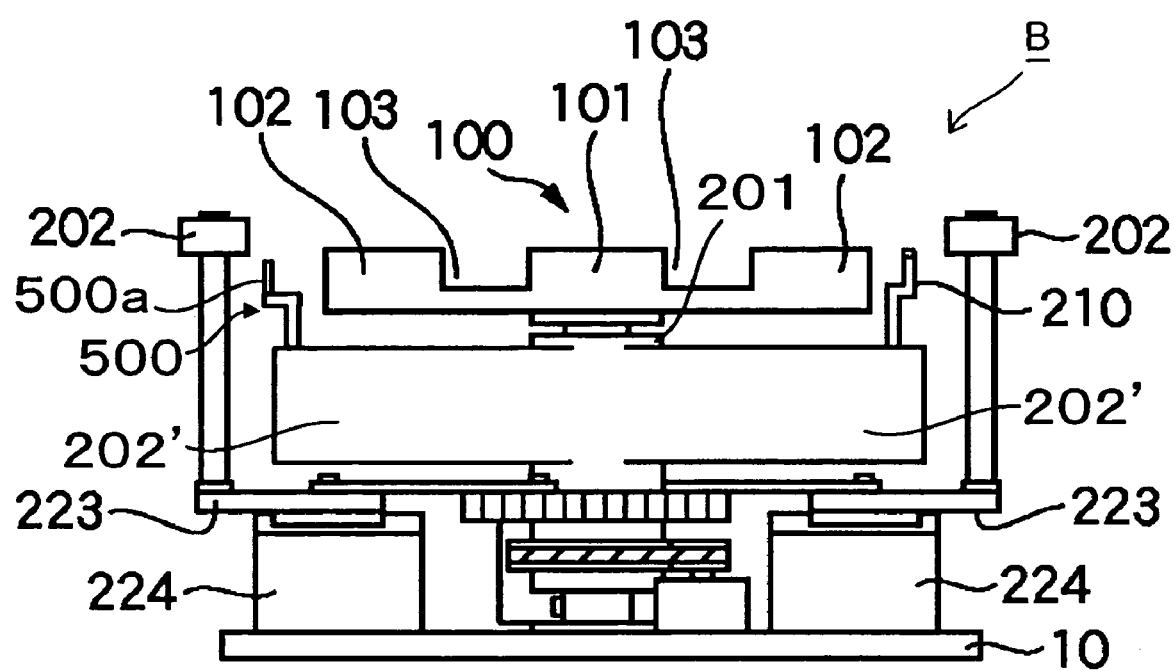
FIG. 17 is a schematic front view of the substrate aligning system B.

In the above embodiment, the wafer W is rotated while it is aligned by the rollers 220. If a guide member to be described is provided, when the wafer W is to be rotated, it will not be aligned by the rollers 220 but the rollers 220 may be positioned at the standby positions. FIG. 16 is a schematic plan view of a substrate aligning system B provided with a guide member, and FIG. 17 is a schematic front view of the substrate aligning system B. Referring to FIGS. 16 and 17, the same constituent elements as in the substrate aligning system A are denoted by the same reference numerals. Only constituent elements that are different from their counterparts in the substrate aligning system A will be described hereinafter.

In the substrate aligning system A, the arm portion 202 extends to one side of the rotary portion 201. The substrate aligning system B is provided with an arm portion 202' which extends to the two sides of a rotary portion 201. The arm portion 202' is connected to the rotary portion 201 at its central portion. One end of the arm portion 202' is provided with an contacting member 210 identical to that described above, and the other end of the arm portion 202' is provided with a guide member 500. The contacting member 210 and guide member 500 are disposed at positions substantially symmetrical with respect to the center of rotation (the axis C2 described above) of the rotary portion 201. The guide member 500 is vertically moved by an arrangement which is identical to the elevating mechanism of the contacting member 210 described with reference to FIG. 5A, and has a guide portion 500a with an arcuate shape to conform to the shape of the peripheral portion of a wafer W. Note that the contacting member 210 and guide member 500 can also be vertically moved by vertically moving the entire arm portion 202'.

Figure 18:
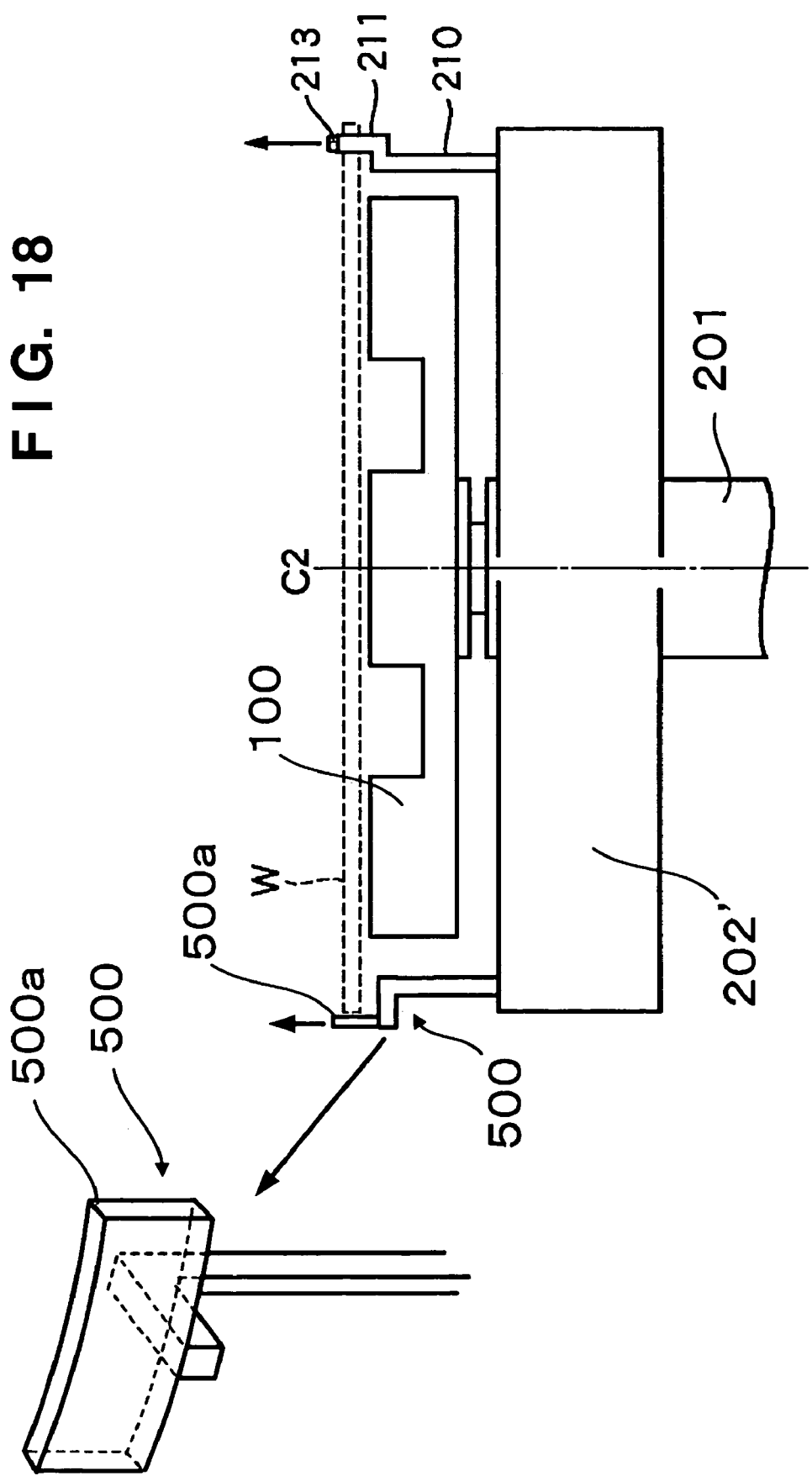
FIG. 18 is a view for explaining a state of the substrate aligning system B wherein a contacting member 210 and guide member 500 are to move upward.

A state wherein the contacting member 210 and guide member 500 are to move vertically will be described. FIG. 18 is a view for explaining a state wherein the contacting member 210 and guide member 500 are to move upward. FIG. 17 shows a state wherein the contacting member 210 and guide member 500 are to move downward. In this embodiment, when respective rollers 220 are at standby positions, the contacting member 210 and guide member 500 can move upward. When the respective rollers 220 are at aligning positions, the contacting member 210 and guide member 500 move downward.

First, in the downward motion, as shown in FIG. 17, the upper end of the contacting member 210 is located under the wafer W, a contacting portion 211 is at a non-contacting position where it does not contact the edge of a chip Wa, and the guide member 500 is also at a retreat position under the wafer W. When the guide member 500 is at the retreat position, it does not interfere with any roller 220. In the upward motion, as shown in FIG. 18, the contacting member 210 is at a contacting position where it contacts the edge of the chip Wa. The guide member 500 is located at a defining position where the inner side surface of the guide portion 500a can contact the peripheral portion of the wafer W. As shown by the enlarged view of FIG. 18, the inner side surface of the guide portion 500a arcuately conforms to the shape of the peripheral shape of the wafer W, so as to define the position of the peripheral portion of the wafer W. When the wafer W is to cause misalignment during its rotation, it contacts the inner side surface of the guide portion 500a to prevent misalignment. The guide portion 500a can realize the same function if the outer peripheral portion of the substrate is fixed by the vacuum in place of supporting from below.

<System Operation>

Figure 19A:
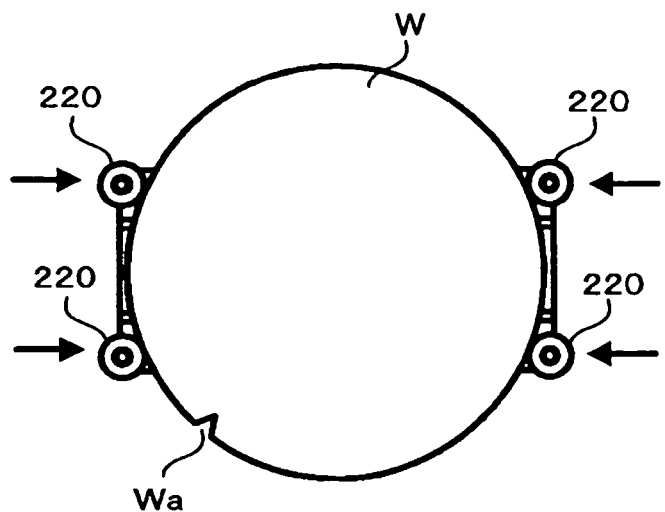
FIG. 19A is a view for explaining the operation of the substrate aligning system B.

The operation of the substrate aligning system B having the above structure will be described with reference to FIGS. 19A to 19E. An operation that is different from that of the substrate aligning system A will be mainly described. As shown in FIG. 19A, the wafer W which has been processed by a certain processing apparatus is held on hand portions 301 of an arm 300 of a transfer device and transported to the substrate aligning system B. When the wafer W is to be transported, the rollers 220 are set at the standby positions while the contacting member 210 and guide member 500 are set at lower positions. After the wafer W is transported, the rollers 220 are moved from the standby positions to the aligning positions to align the center of the wafer W. As a result, a center C1 of the wafer W coincides with the center of rotation (axis C2). At this time, the contacting member 210 and guide member 500 are kept at the lower positions.

Figure 19B:
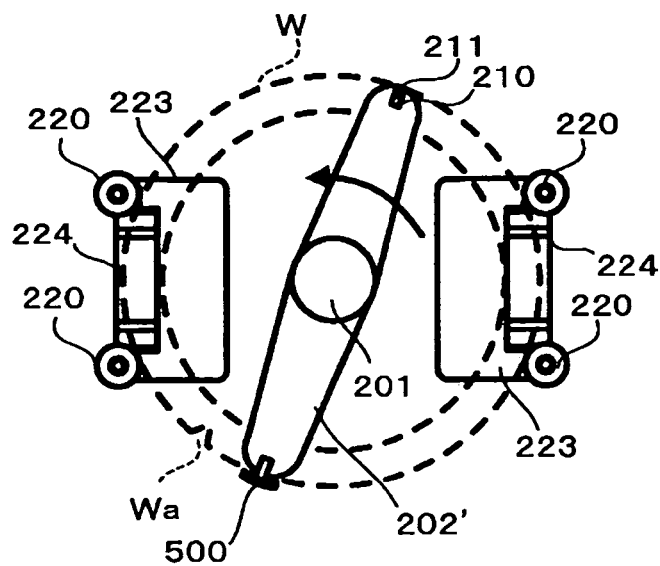
FIG. 19B is a view for explaining the operation of the substrate aligning system B.

When center alignment of the wafer W is ended, a step of detecting the position of the chip Wa of the wafer W is performed. In this case, as shown in FIG. 19B, the rotary portion 201 is rotated to pivot the arm portion 202' about the axis C2. A sensor 213 arranged at the upper end of the contacting member 210 moves along the peripheral portion of the wafer W to scan the peripheral portion.

Figure 19C:
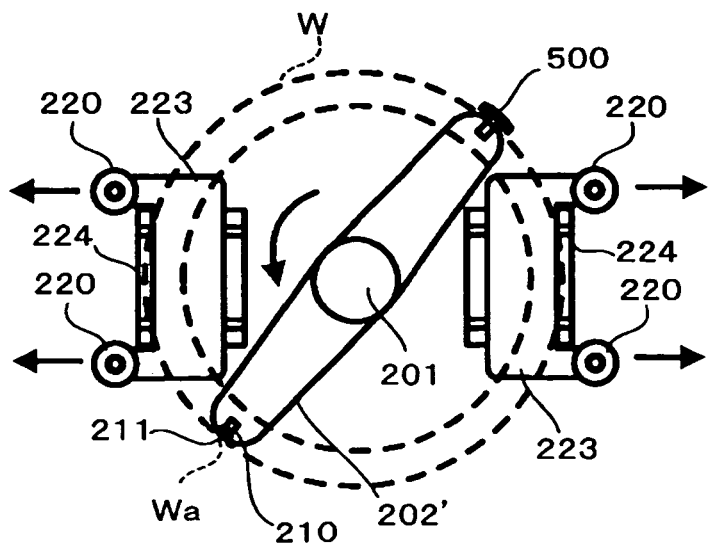
FIG. 19C is a view for explaining the operation of the substrate aligning system B.

When the sensor 213 detects the chip Wa of the wafer W, a motor 205 is stopped to stop the pivotal motion of the arm portion 202', so the contacting portion 211 of the contacting member 210 is positioned immediately under the chip Wa, as shown in FIG. 19C. Then, the rollers 220 are moved to the standby positions. According to this embodiment, unlike in the substrate aligning system A, when the wafer W is to be rotated, the position of the peripheral portion of the wafer W is not defined by the rollers 220. Instead, misalignment is prevented by the guide member 500.

Figure 19D:
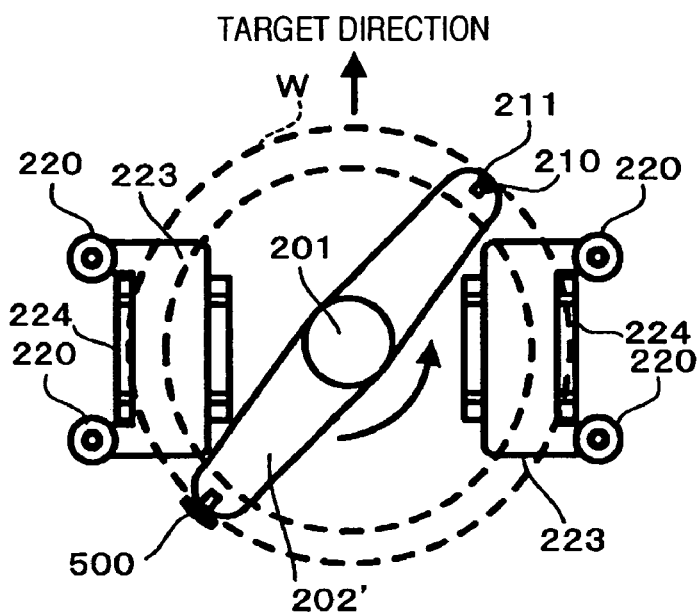
FIG. 19D is a view for explaining the operation of the substrate aligning system B.

Then, the contacting member 210 and guide member 500 are moved upward. The contacting portion 211 of the contacting member 210 enters the chip Wa so that it can contact the edge of the chip Wa. The inner side surface of the guide portion 500a of the guide member 500 can contact the peripheral portion of the wafer W. Subsequently, the motor 205 is driven to pivot the arm portion 202', as shown in FIG. 19D. Consequently, the contacting portion 211 moves arcuately and pivots to press the edge of the chip Wa, thus rotating the wafer W. As the guide portion 500a of the guide member 500 regulates movement of the wafer W, the wafer W is rotated while its center is kept aligned.

Figure 19E:
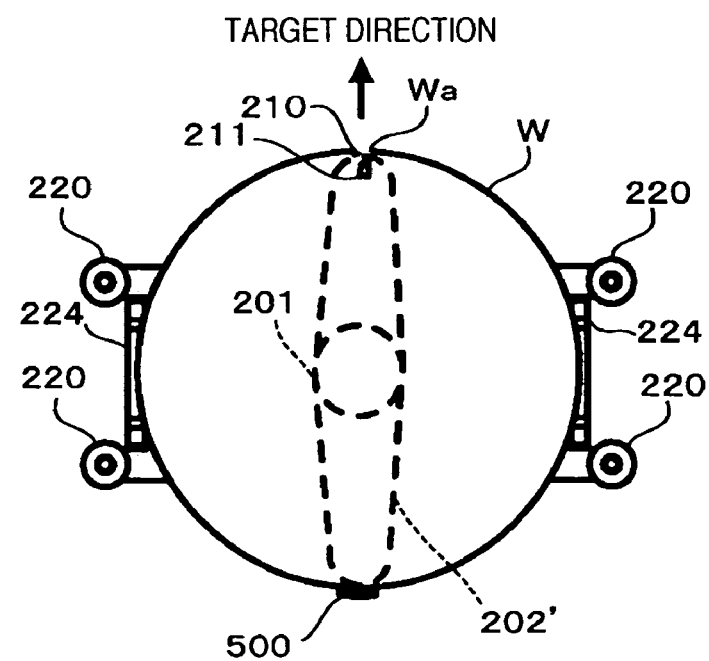
FIG. 19E is a view for explaining the operation of the substrate aligning system B.

The arm portion 202' pivots until the chip Wa of the wafer W is set in a predetermined target direction. When the chip Wa of the wafer W is soon set in the predetermined target direction, as shown in FIG. 19E, the motor 205 is stopped to stop the pivotal motion of the arm portion 202. Thus, center alignment and adjustment of the orientation of the wafer W are ended.

In the substrate aligning system B according to this embodiment, when the wafer W rotates, the guide member 500 pivots together with the wafer W. In the substrate aligning system A described above, as the positions of the rollers 220 do not change, the wafer W may rub against the rollers 220 to generate particles or the like. In the substrate aligning system B, the wafer W does not rub against the guide portion 500a, so that generation of particles or the like can be prevented effectively.

<Still Another Embodiment of Substrate Alignment>

Figure 20:
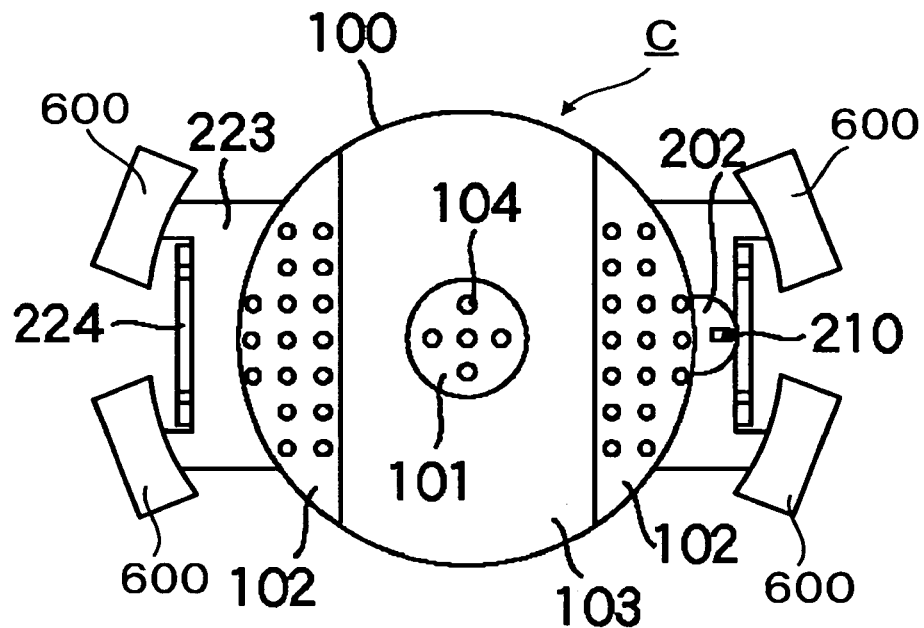
FIG. 20 is a schematic plan view of a substrate aligning system C which performs alignment with air.
Figure 21:
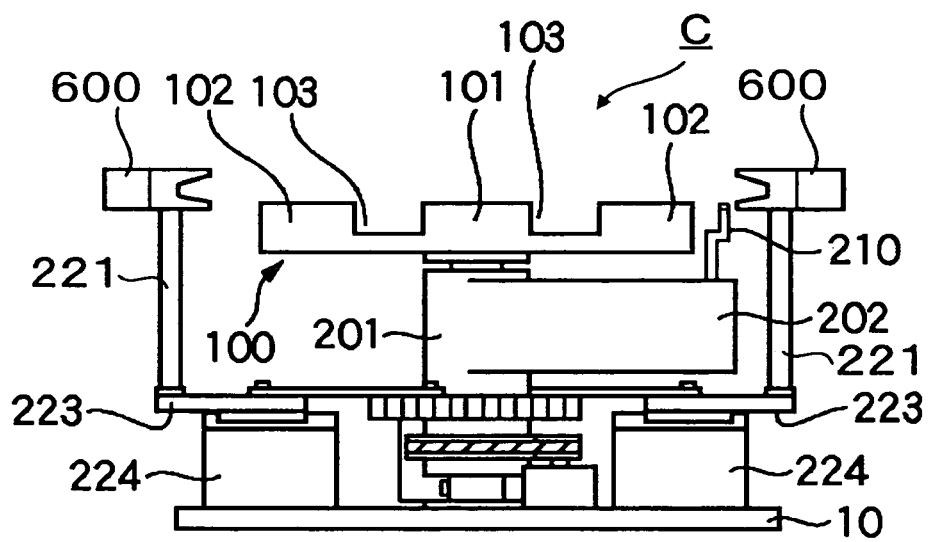
FIG. 21 is a schematic front view of the substrate aligning system C.

In the substrate aligning system A, the wafer W is aligned by the rollers 220. The wafer W can also be aligned by air in a noncontact manner. FIG. 20 is a schematic plan view of a substrate aligning system C which performs alignment with air, and FIG. 21 is a schematic front view of the substrate aligning system C. Referring to FIGS. 20 and 21, the same constituent elements as in the substrate aligning system A are denoted by the same reference numerals. Only constituent elements that are different from their counterparts in the substrate aligning system A will be described hereinafter.

In the substrate aligning system C, in place of the rollers 220, air injection devices 600 are provided as a defining means for defining the position of the peripheral portion of the wafer W, so the center of a wafer W coincides with the center of rotation (axis C2). The plurality of (four in this example) air injection devices 600 are disposed around the wafer W and fixed on corresponding support columns 221. When the air injection devices 600 are fixed to the support columns 221, they can be moved by a moving unit 200 in the same manner as the rollers 220 are.

Figure 22A:
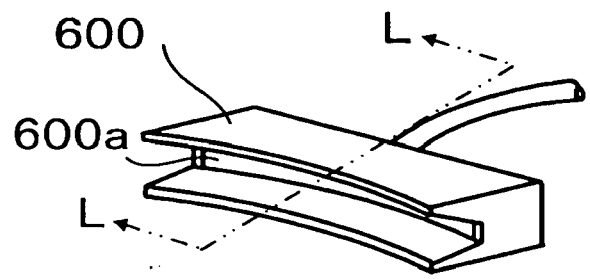
FIG. 22A is an outer perspective view of an air injection device 600.
Figure 22B:
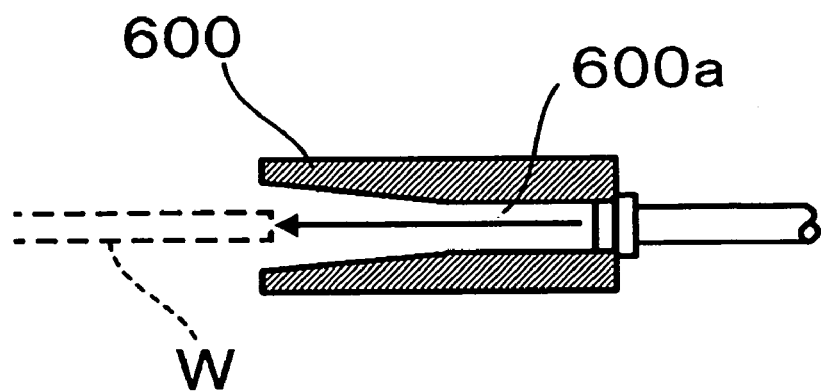
FIG. 22B is a sectional view taken along the line L-L of FIG. 22A.

FIG. 22A is an outer perspective view of the air injection device 600, and FIG. 22B is a sectional view taken along the line L-L of FIG. 22A. That side portion of the air injection device 600 which is on the wafer W side arcuately conforms to the shape of the peripheral portion of the wafer W, and has a slit which opens to the wafer W. An air injection port 600a is formed in the deep portion of the air injection device 600. The slit has such a width (a width in the direction of thickness of the wafer W) that the wafer W can enter it. As shown in FIGS. 22A and 22B, the deep end of the injection port 600a is connected to one end of a pipe. The other end of the pipe is connected to an air supply device (not shown) such as a pump. Air fed from the air supply device with pressure passes through the pipe described above and is injected from the injection port 600a toward the peripheral portion of the wafer W.

Figure 23:
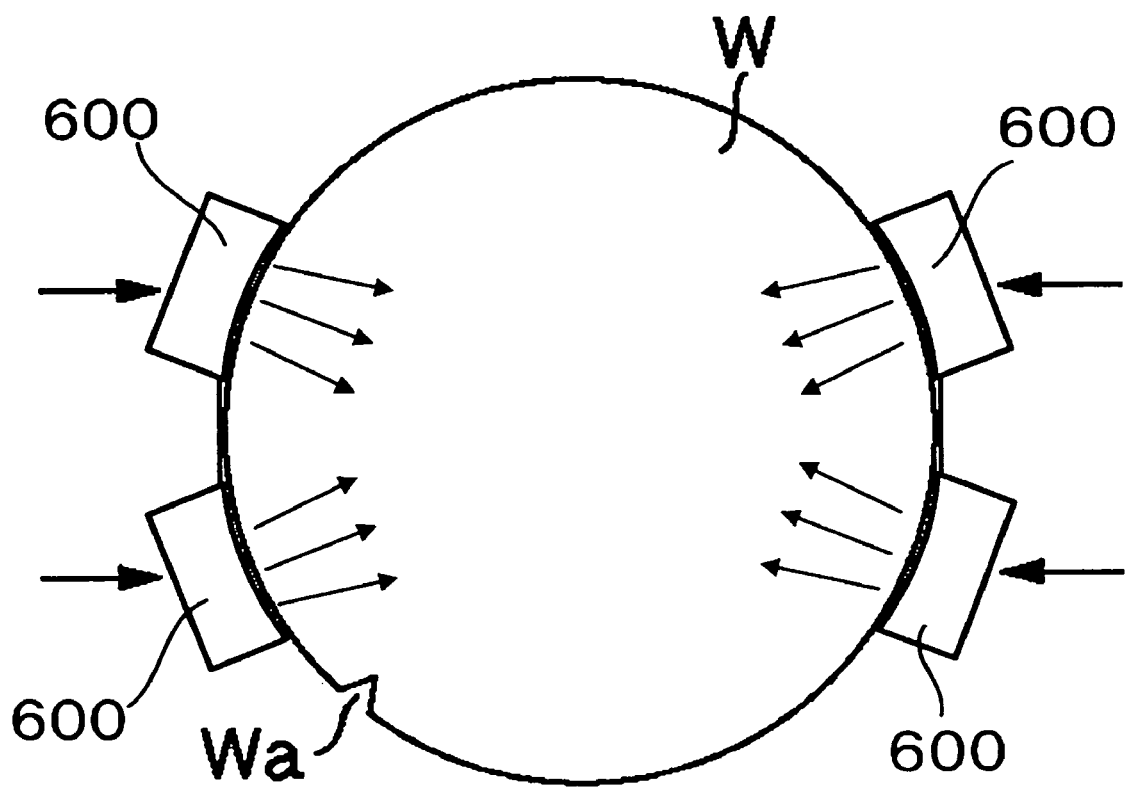
FIG. 23 is a view for explaining a state wherein respective air injection devices 600 move from standby positions to aligning positions.

The operation of the substrate aligning system C having the above structure will be described. In this case, an operation (aligning operation for the wafer W) which is different from that of the substrate aligning system A will mainly be described. When the wafer W is processed by a certain processing apparatus and is to be transported to the substrate aligning system C, the respective air injection devices 600 are located at the standby positions separate from the peripheral portion of the wafer W, in the same manner as the rollers 220 are. When the wafer W are transported, in the substrate aligning system C, a motor 227 is driven to move the respective air injection devices 600 from the standby positions to aligning positions to align the center of the wafer W. The respective air injection devices 600 move from the standby positions to the aligning positions while injecting air. FIG. 23 is a view for explaining a state wherein the air injection devices 600 move from the standby positions to the aligning positions.

According to this embodiment, of the four air injection devices 600, the upper right and lower left air injection devices 600, and the lower right and upper left air injection devices 600 are symmetrical with respect to the center of rotation (the axis C2 described above). Air injected from the respective air injection devices 600 is injected toward the center of rotation (the axis C2 described above) with substantially the same pressures. Hence, when the center (C1) of the wafer W is misaligned from the center of rotation (the axis C2 described above) on a support table 100, air injected from the respective air injection devices 600 biases the wafer W to move. The wafer W is stopped when the pressures from air injected from the respective air injection devices 600 balance. Consequently, a center C1 of the wafer W coincides with the center of rotation (axis C2). After that, the wafer W is rotated in the same manner as in the substrate aligning system A to adjust its orientation.

According to this embodiment, the center of the wafer W can be aligned in a noncontact manner. When compared to a case wherein center alignment of the wafer W is performed in a contact manner using the rollers 220, generation of particles or the like can be prevented effectively. Although the four air injection devices 600 are provided in this embodiment, a minimum of three air injection devices 600 suffice to align the center of the wafer W. Also, five or more air injection units may naturally be provided.

<Others>

While the various embodiments of the present invention have been described, the present invention is not limited to them. The respective embodiments described above can be arbitrarily combined to constitute the present invention, as a matter of course.

The invention claimed is:

1. A substrate aligning system adjusting an orientation of a circular substrate having a chip in a peripheral portion thereof to indicate the orientation of the substrate, said system comprising
a support device for supporting the substrate substantially horizontally in noncontact manner with the substrate,
a sensor for detecting the chip of the substrate supported by said support device, and
a substrate rotating device for rotating the substrate supported by said support device about a center thereof to adjust the orientation of the substrate,
wherein said substrate rotating device includes
a contacting member for contacting an edge of the chip,
a moving unit for moving said contacting member about a predetermined center of rotation, and
defining means for defining a position of the peripheral portion of the substrate so that the center of the substrate coincides with the center of rotation.

2. The substrate aligning system according to claim 1, wherein said contacting member has one of a size and shape that prevent free rotation from the substrate.

3. The substrate aligning system according to claim 1, wherein
the chip comprises a notch type chip, and
said contacting member has one of a size and shape with which said contacting member substantially contacts edges of two sides in a circumferential direction of the chip of the substrate.

4. The substrate aligning system according to claim 1, wherein
said moving unit comprises
a rotary portion for rotating about the center of rotation, and
an arm portion connected to said rotary portion and to which said contacting member is provided, and
wherein said system further comprises a moving mechanism provided to said arm portion, and
said moving mechanism moves said contacting member between a contacting position where said contacting member contacts the edge of the chip and a noncontacting position.

5. The substrate aligning system according to claim 4, wherein said sensor is provided to said arm portion.

6. The substrate aligning system according to claim 4, wherein said sensor is provided to said contacting member.

7. The substrate aligning system according to claim 1, wherein
said defining means comprises a plurality of rollers which freely rotate, and
said system further comprises a roller moving device for moving said plurality of rollers between a first position where said plurality of rollers contact the peripheral portion of the substrate and a second position where said plurality of rollers separate from the peripheral portion of the substrate.

8. The substrate aligning system according to claim 1, wherein
said support device includes a table having an injection port through which air is injected to float the substrate, and
said table has a groove where a hand portion of a transfer device which transfers the substrate is allowed to enter.

9. The substrate aligning system according to claim 7, further comprising cover members for covering said respective rollers individually, wherein
said cover members respectively have slits through which the peripheral portion of the substrate passes and exhaust ports through which air in said cover members is discharged externally, and
said roller moving device moves said cover members together with said rollers.

10. The substrate aligning system according to claim 1, wherein
said moving unit comprises
a rotary portion for rotating about the center of rotation, and
an arm portion connected to said rotary portion, and
wherein said arm portion includes a first end to which said contacting member is provided and a second end to which a guide member defining a position of the peripheral portion of the substrate is provided.

11. The substrate aligning system according to claim 10, wherein said contacting member and guide member are disposed at positions substantially symmetrical with respect to the center of rotation.

12. The substrate aligning system according to claim 10, further comprising
a moving device for moving said defining means between a first position to define the position of the peripheral portion of the substrate and a second position separate from the peripheral portion of the substrate, and
an elevating device for elevating said contacting member and guide member, wherein
when said contacting member and guide member are moved to upward positions by said elevating device, said contacting member contacts the edge of the chip and said guide member defines the position of the peripheral portion of the substrate,
when said contacting member and guide member are moved to downward positions by said elevating device, said contacting member and guide member are positioned under the substrate, when said defining means is at the first position, said contacting member and guide member are at the downward positions, and when said defining means is at the second position, said contacting member and guide member can move to the upward positions.

13. The substrate aligning system according to claim 1, wherein said defining means comprises a plurality of air injection devices disposed around the substrate, and said air injection devices inject air to the peripheral portion of the substrate.

* * * * *